United States Patent
Tan et al.

(10) Patent No.: US 8,922,003 B2
(45) Date of Patent: Dec. 30, 2014

(54) LOW OHMIC CONTACTS

(75) Inventors: Dexter Xueming Tan, Singapore (SG); Yoke King Chin, Singapore (SG); Kin Leong Pey, Singapore (SG)

(73) Assignees: GLOBALFOUNDRIES Singapore Pte. Ltd., Singapore (SG); Nanyang Technological University, Singapore (SG)

( * ) Notice: Subject to any disclaimer, the term of this patent is extended or adjusted under 35 U.S.C. 154(b) by 49 days.

(21) Appl. No.: 13/353,336

(22) Filed: Jan. 19, 2012

(65) Prior Publication Data

US 2013/0187264 A1   Jul. 25, 2013

(51) Int. Cl.
H01L 23/48 (2006.01)
H01L 21/28 (2006.01)
H01L 21/26 (2006.01)

(52) U.S. Cl.
USPC ........... 257/734; 257/E21.328; 257/E21.158; 257/E23.01; 438/660; 438/597

(58) Field of Classification Search
USPC ....... 257/27, 390–393, E21.334, E21.409, 4, 257/213, 408, 412, 413, 734, E21.12, 257/E21.158, E21.324, E21.328, E21.454, 257/E21.497, E23.01, E29.166, E47.001; 438/510, 597, 660; 326/38
IPC ........... H01L 29/66,47/00, 29/94; H03K 19/173
See application file for complete search history.

(56) References Cited

U.S. PATENT DOCUMENTS

| | | | |
|---|---|---|---|
| 6,287,925 B1 * | 9/2001 | Yu | 438/301 |
| 6,987,050 B2 | 1/2006 | Cabral, Jr. et al. | |
| 2009/0286373 A1 * | 11/2009 | Tan et al. | 438/301 |

OTHER PUBLICATIONS

Y. Setiawan et al., Laser-induced Ni(Ti) silicide formation, Applied Physics Letters, Mar. 15, 2006, pp. 1-3, vol. 88, 113108 (2006), American Institute of Physics.
P. Baeri et al., Epitaxial NiSi layers on <111>-oriented Si obtained by pulsed laser irradiation, J. Appl. Phys., Mar. 10, 1989, pp. 861-866, vol. 66, American Institute of Physics.
Hiu Yung Wong et al., Elimination of Poly-Si Gate Depletion for Sub-65-nm-CMOS Technologies by Excimer Laser Annealing, IEEE Electron Device Letters, Apr. 2005, pp. 234-236, vol. 26, No. 4.
Bin Yu et al., 70nm MOSFET with Ultra-Shallow, Abrupt, and Super-Doped S/D Extension Implemented by Laser Thermal Process (LTP), IEDM 99, 1999, pp. 509-512, CA.
M. G. Grimaldi et al., Epitaxial NiSi2 formation by pulsed laser irradiation of thin Ni layers deposited on Si substrates, Appl. Phys. Lett., May 12, 1983, pp. 244-246, vol. 43, American Institute of Physics.
Giovanni Mannino et al., Depth distribution of B implanted in Si after excimer laser irradiation, Applied Physics Letters, Jan. 28, 2005, pp. 1-3, vol. 86, 051909 (2005), American Institute of Physics.
Dexter Xueming Tan et al., Vacancy Generation by Laser Preirradiation for Junction Leakage Suppression, IEEE Electron Device Letters, Dec. 2009, pp. 1263-1265, vol. 30, No. 12.
D. X. M. Tan et al., Vacancy engineering by optimized laser irradiation in boron-implanted, preamorphized silicon substrate, Applied Physics Letters, May 21, 2008, pp. 1-3, vol. 92, 203107 (2008), American Institute of Physics.

* cited by examiner

*Primary Examiner* — Fernando L Toledo
*Assistant Examiner* — Lawrence-Linh T Nguyen
(74) *Attorney, Agent, or Firm* — Horizon IP Pte. Ltd.

(57) ABSTRACT

A method for forming a device is disclosed. A substrate with a contact region is provided. Vacancy defects are formed in the substrate. The vacancy defects have a peak concentration at a depth $D_V$. A metal based contact is formed in the contact region. The metal based contact has a depth $D_C$ which is equal to about $D_V$. The vacancy defects lower the resistance of the metal based contact with the substrate.

19 Claims, 32 Drawing Sheets

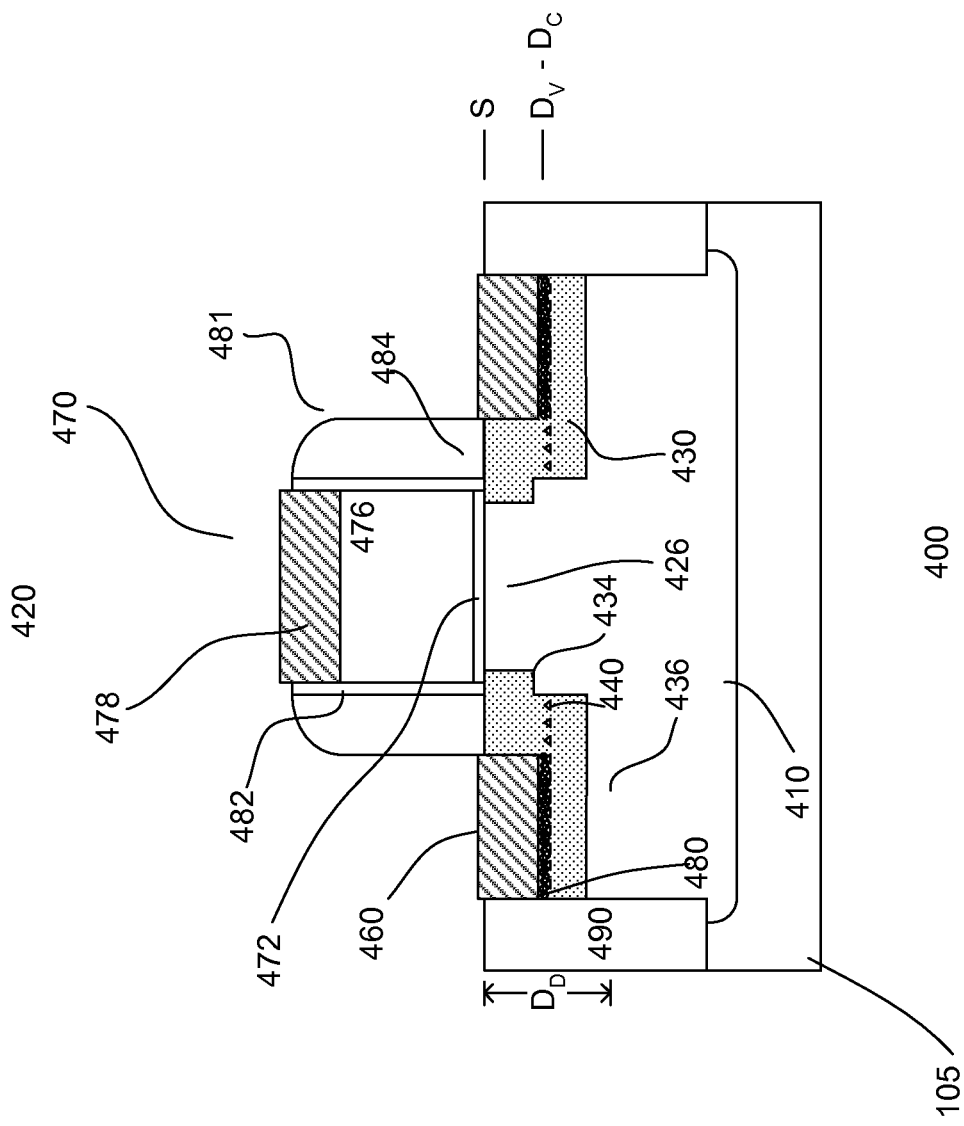

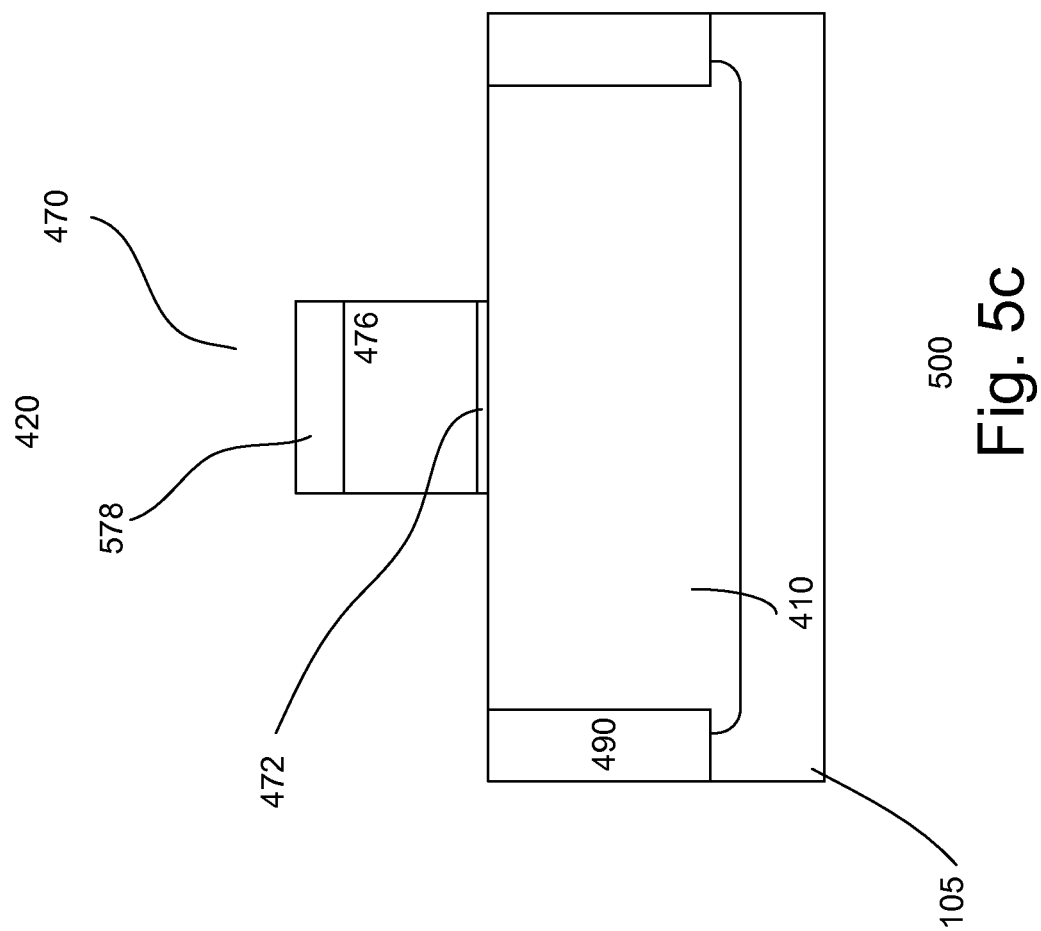

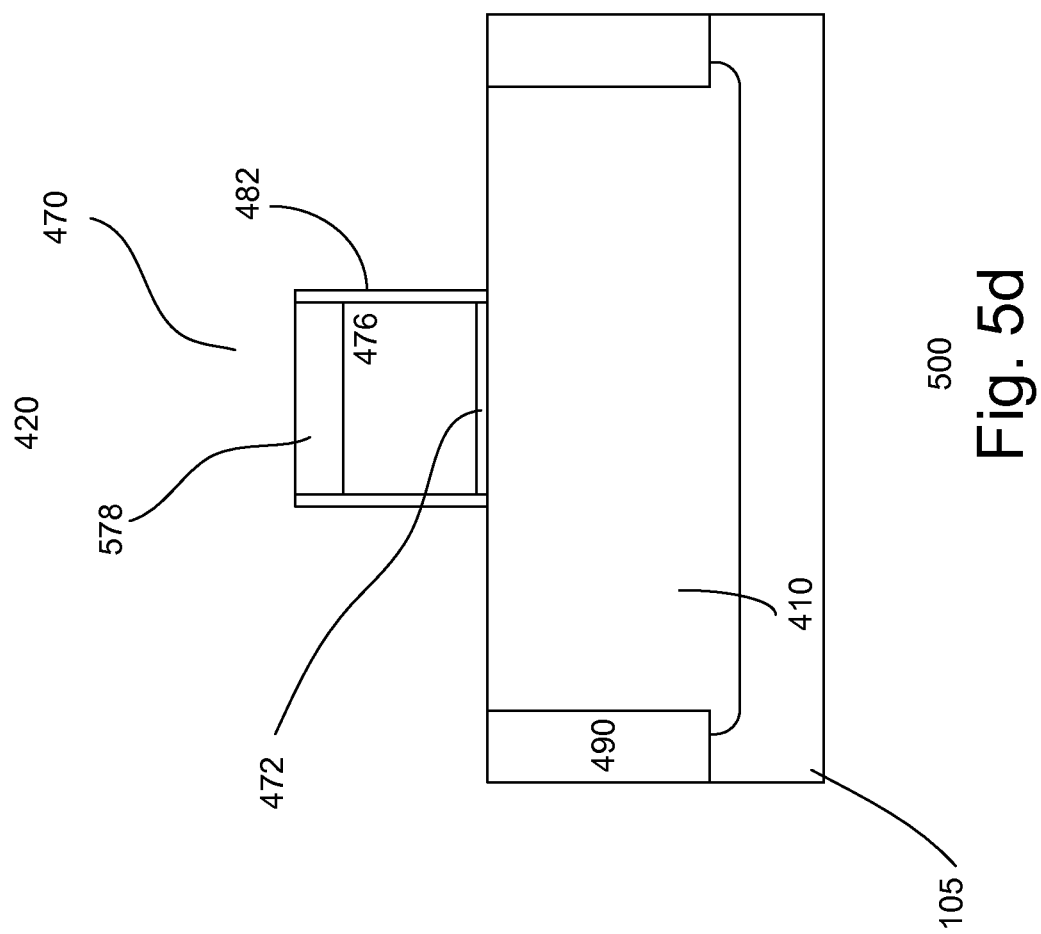

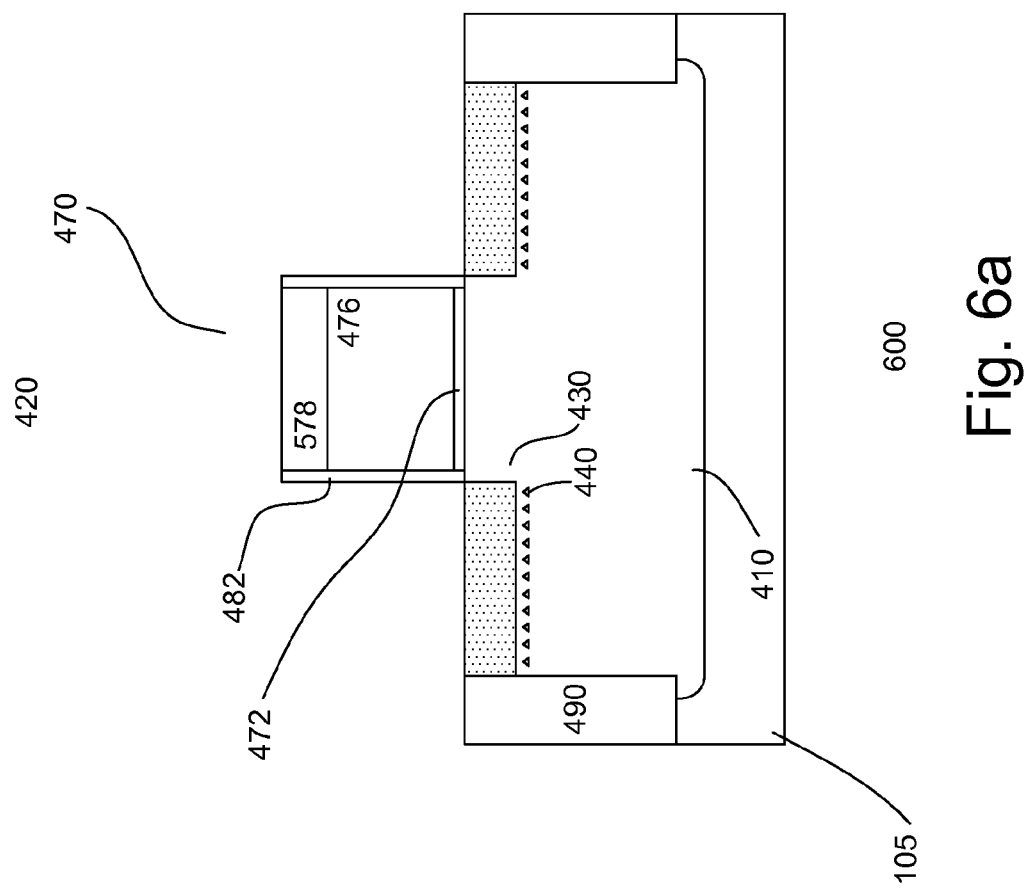

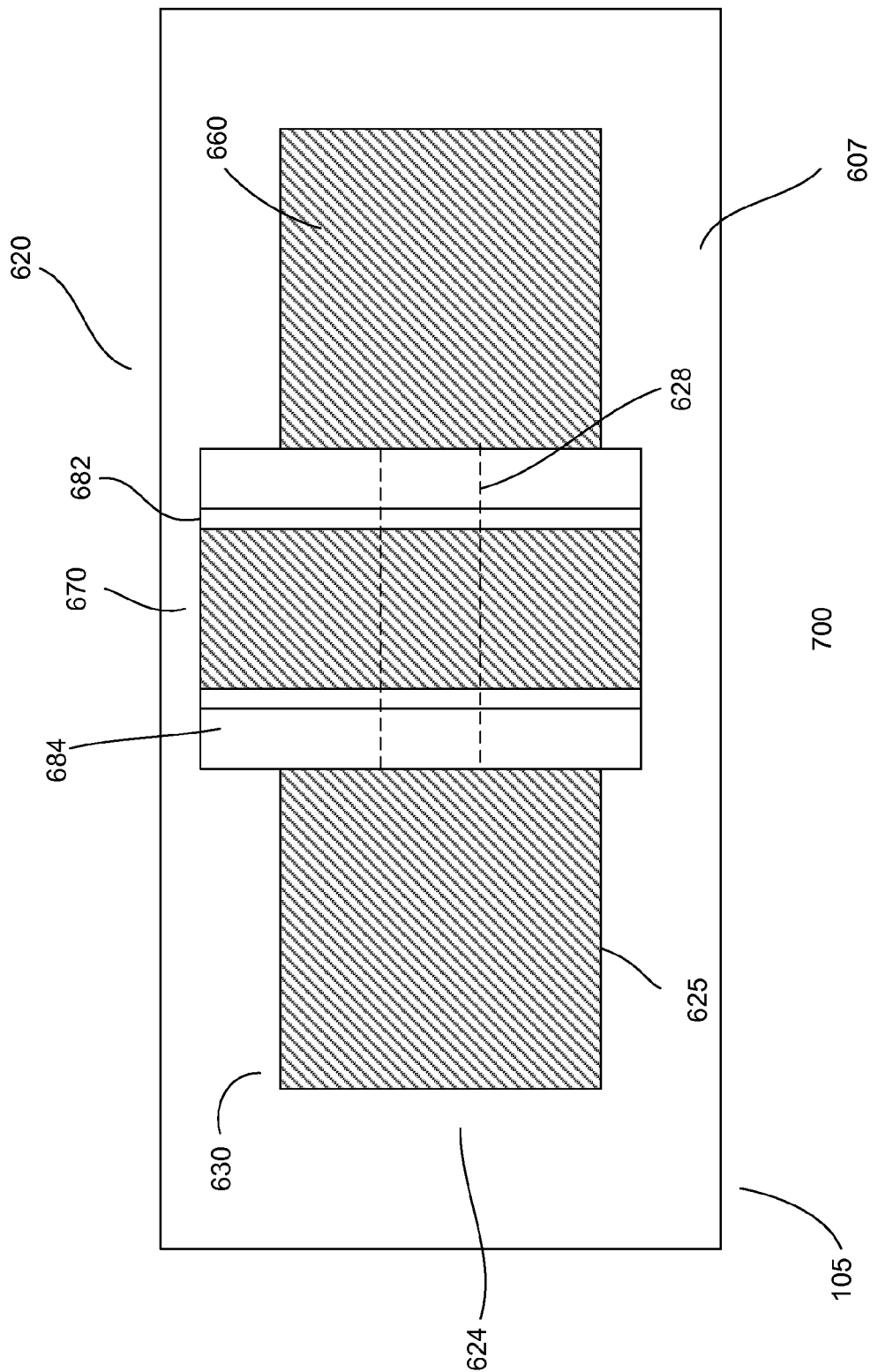

LOW OHMIC CONTACTS

BACKGROUND

Integrated circuits (ICs) include many tens of thousands of semiconductor devices including transistors are a cornerstone of modern microelectronic systems. The various regions of the transistors (e.g., source/drain and source/drain extensions) are formed by introducing dopant atoms into a semiconductor substrate using methods such as ion implantation. After the dopants have been introduced, they are electrically activated by subjecting the semiconductor substrate to one or more annealing processes.

Unfortunately, dopants have a tendency to diffuse or expand both laterally and vertically away from the profile as-introduced during annealing thereby increasing the dimensions of the various device regions. This outward diffusion of dopants is undesirable particularly as semiconductor devices are scaled down in size.

In addition, one of the major concerns in device scaling is the contact resistance between the silicide and the doped junction. The contribution of the silicide to junction contact resistance increases with further scaling of transistors. This undesirably leads to degradation of device performance.

From the foregoing discussion, it is desirable to provide devices with improved performance.

SUMMARY

Embodiments generally relate to semiconductor devices or integrated circuits (ICs). In one embodiment, a method for forming a device is presented. The method includes providing a substrate with a contact region. Vacancy defects are formed in the substrate. The vacancy defects have a peak concentration at a depth $D_V$. A metal based contact is formed in the contact region. The metal based contact has a depth $D_C$ which is equal to about $D_V$. The vacancy defects lower the resistance of the metal based contact with the substrate.

In another embodiment, a device is presented. The device includes a substrate with a contact region. The device further includes vacancy defects in the substrate. The vacancy defects have a peak concentration at a depth $D_V$. The device also includes a metal based contact in the contact region. The metal based contact has a depth $D_C$ which is equal to about $D_V$. The vacancy defects lower the resistance of the metal based contact with the substrate.

These and other advantages and features of embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 4 shows another embodiment of a device;
FIGS. 5a-j show an embodiment of a process for forming a device;
FIGS. 6a-c show another embodiment of a process for forming a device;
FIGS. 7a-b show top and cross-sectional views of an embodiment of a device.

DETAILED DESCRIPTION

Embodiments generally relate to semiconductor devices or integrated circuits (ICs). The device may be various types of ICs. For example, the device may be a dynamic or static random access memory, signal processor, or system-on-chip. Other types of devices may also be useful. The devices can be incorporated into, for example, consumer electronic products, such as computers, cell phones, and personal digital assistants (PDAs).

Figure 1A:
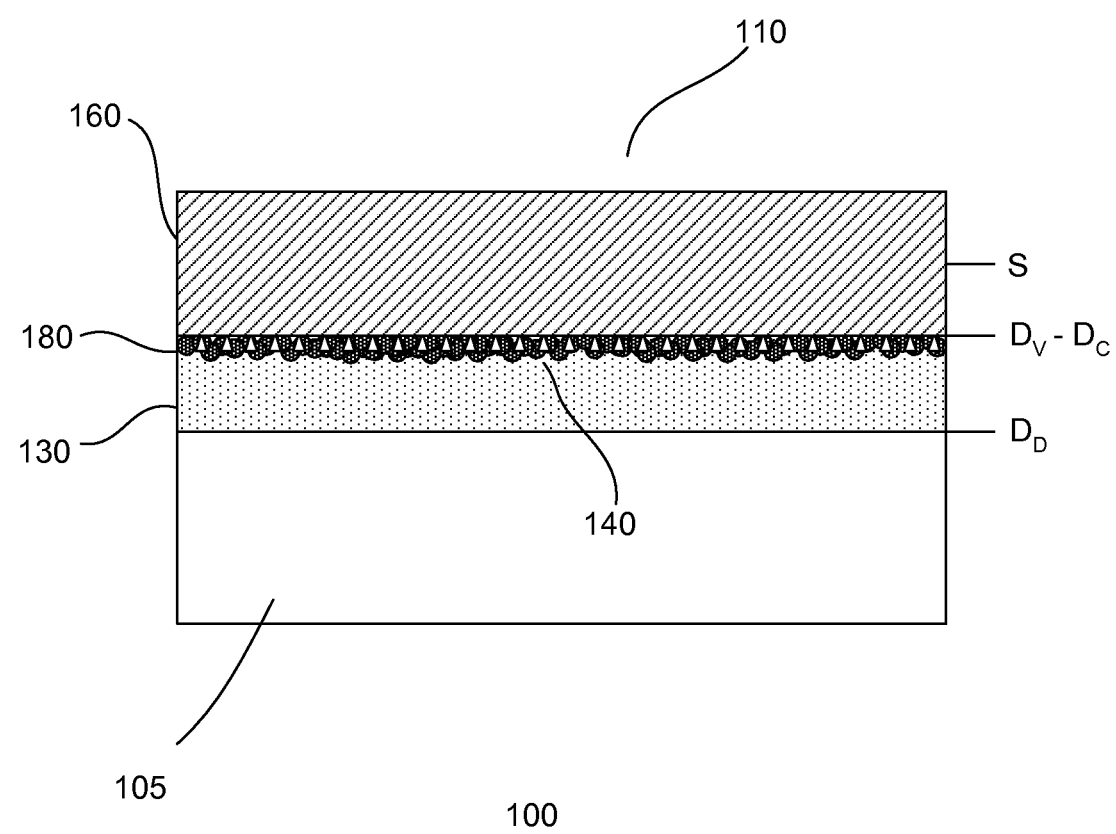
FIGS. 1a-b show embodiments of devices.

FIG. 1a shows a cross-sectional view of a portion 100 of an embodiment of a device. As shown, the device includes a substrate 105. The substrate, for example, is a silicon substrate. Other types of substrates, such as silicon germanium, germanium, gallium arsenide, or crystal-on-insulator (COI) such as silicon-on-insulator (SOI), are also useful. The substrate maybe a doped substrate. For example, the substrate can be lightly doped with p-type dopants or n-type dopants. P-type dopants may include boron (B), aluminum (Al), indium (In) or a combination thereof, while n-type dopants may include phosphorous (P), arsenic (As), antimony (Sb) or a combination thereof. Providing a substrate with other types of dopants or concentrations, including no dopants, may also be useful.

The substrate, as shown, represents a contact region 110. The contact region includes a doped contact region 130 having first polarity type dopants. The first polarity type may be p-type. The first polarity type may alternatively be n-type. In one embodiment, the doped contact region is heavily doped with first polarity type dopants. The contact region, for example, may be a source/drain region of a transistor. Other types of contact regions may also be useful. For example, the contact region may be a junction contact, such as a contact to a doped well, body well, or junction varactor. A depth $D_D$ of the doped contact region is from a substrate surface S. The depth $D_D$, for example, may be in the order of nanometers-micrometers. The depth, for example, may depend on the technology node. Providing a doped contact region having other depths and/or dopant concentrations may also be useful.

The doped contact region forms a junction at, for example, about $D_D$. The junction, for example, is located at the interface of the doped contact region or $D_D$ and the substrate. In one embodiment, the junction may be a first/second polarity type junction. For example, the doped contact region forms a PN junction with the substrate. The PN junction may be formed by providing a substrate with a second polarity type doped substrate region. The second polarity type doped region may be a doped well. The doped well may, for example, serve as a body well of a transistor. Other purposes for the doped well may also be useful. For example, the doped well may be well of a junction varactor. Alternatively, the doped well may be part of a triple or multiple well structure.

In one embodiment, the second polarity type doped substrate region may be a n-type doped substrate region. The n-type doped substrate region may include n-type dopants, such as arsenic (As) or phosphorous (P). The doped well may be a lightly doped well. For example, the doped well may have a dopant concentration of about $\leq 10^{17}$ atoms/cm$^3$. Providing a doped substrate region with other dopant types, such as a p-type substrate region, or concentrations may also be useful. In other embodiments, the doped substrate region may be a doped substrate, such as a lightly doped substrate. Other types of doped substrates may also be useful.

The contact region includes vacancies 140. The vacancies, in one embodiment, are laser induced vacancies. For example, the vacancies are created by exposure to laser pulses. Various types of lasers may be employed to form the vacancies. For example, excimer lasers, such as KrF or XeCl, may be employed. The laser may generate pulses in a wavelength of about 126-351 nm. Other types of laser sources may also be used to form the vacancies. For example, the laser should be able to melt the substrate's top surface instantaneously and facilitates rapid recrystallization quenching rate to induce the formation of vacancy defects. In one embodiment, the spot size of the laser exposure is in the dimensions of micrometers. Other spot size dimensions may also be useful.

A peak concentration of the laser induced vacancy defects is disposed in the substrate at a depth $D_V$, which is equal to about the maximum laser melt depth. The peak concentration of vacancies, for example, may be about $10^{17}$-$10^{18}$ atm/cm$^3$. Other peak concentrations of vacancies may also be useful. The maximum melt depth can be adjusted to the desired depth by selecting the appropriate laser fluence. Laser fluence is a function of laser energy over the laser spot size. For example, the depth of the melted silicon layer is deeper if higher laser fluence is applied. Hence, the location of the highest vacancy concentration resides deeper in the substrate and vice versa. The depths of $D_V$ and $D_D$ may be in the range of nanometers-micrometers, depending on the technology node of the transistor. In one embodiment, $D_V$ is shallower or less than $D_D$. Providing $D_V$ at other depths may also be useful. For example, $D_V$ may be at other depths relative to $D_D$. In one embodiment, $D_V$ is less than (shallower) or equal to about $D_D$.

A metal based contact 160 is disposed in the contact region of the substrate. The metal based contact, in one embodiment, is a combination of the semiconductor crystal substrate material and a metal. For example, in the case of a silicon substrate, the metal based contact is a metal silicide contact. In the case of a germanium substrate, the metal based contact is a metal germanocide contact. Other types of metal based contacts may also be useful, depending on the substrate material. The metal, for example, may be a nickel or nickel alloy metal-semiconductor crystal contact. Other types of metals may also be useful. For example, metals such as titanium, cobalt, or other metals or alloys thereof, including nickel, may be used for the contacts. In one embodiment, the depth of the metal based contact $D_C$ is equal to about $D_V$.

The metal based contact has a low dopant solubility limit. This low solubility limit causes the first polarity type dopants to segregate out of the doped contact region where the metal based contact is disposed. For example, dopants segregate from the doped contact region where the metal based contact is disposed, resulting in high concentrations of dopants 180 piling up (dopant pile up) at the crystal/metal interface (e.g., $D_V$ or $D_C$) where in the vacancies are disposed. For example, the dopants pile up is located at about the silicon/metal based contact interface for a silicon substrate. The vacancies enhance activation of the dopants in the dopant pile up. Furthermore, the vacancies act as a diffusion barrier against the downward diffusion of dopants deeper into the substrate, trapping more dopants at the crystal/metal based contact interface. The high concentration of dopants and enhanced dopant activation at the crystal/metal based contact reduces the effective Schottky barrier, which reduces contact resistance.

Figure 1B:
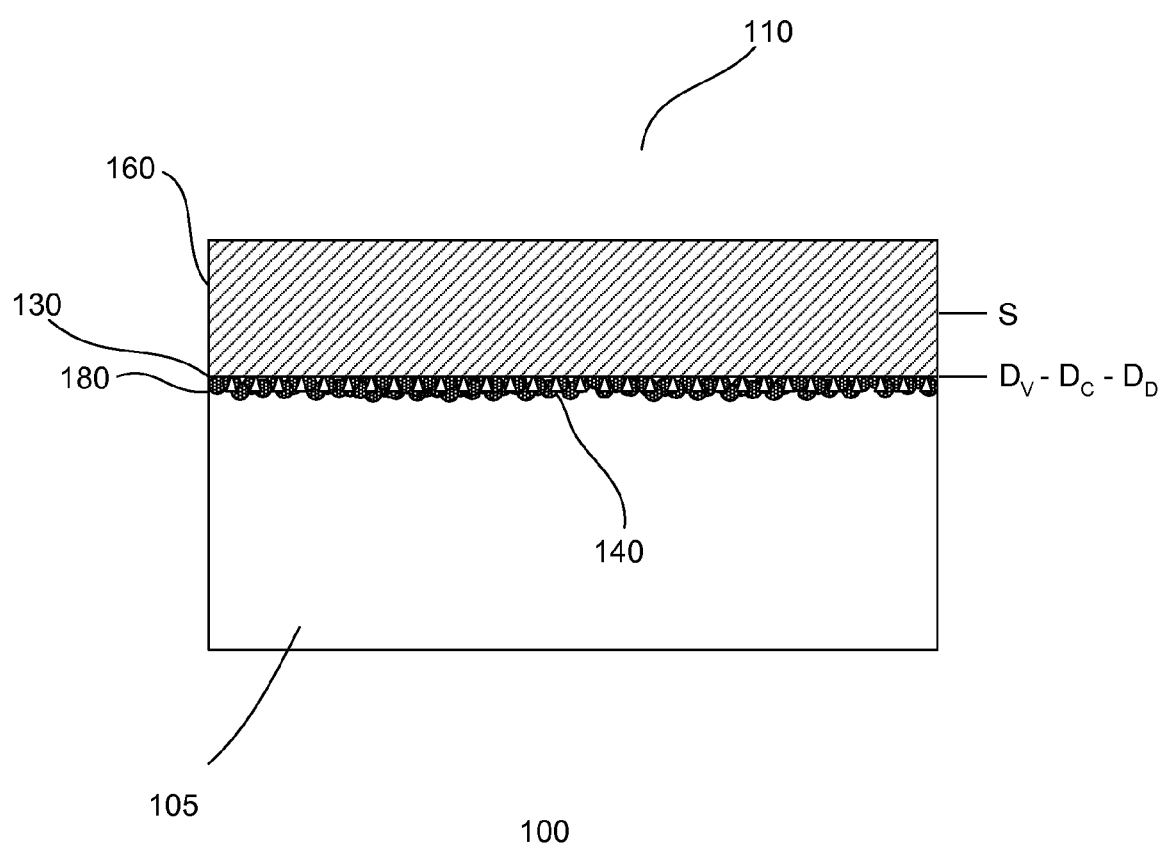

FIG. 1b shows an alternative embodiment of a device 100. The device is similar to the device described in FIG. 1a. Common elements may not be described or described in detail. Referring to FIG. 1b, the device includes a substrate 105 with a contact region 110. In one embodiment, the doped contact region 130 has a depth $D_D$ which is about the same as a depth $D_V$ of the vacancies 140. The metal based contact 160 has a depth $D_C$ which is about the same as about $D_V$. The metal based contact has a depth $D_C$ which is about the same as about $D_D$. In one embodiment, the contact has a depth $D_C$ which is about the same as about $D_V$ and $D_D$. The dopants 180 of the doped contact region pile up at the crystal/metal based contact interface. For example, dopants pile up at the silicon/silicide interface in the case where the substrate is silicon. The contact, as shown, may be a Schottky type contact.

Figure 2A:
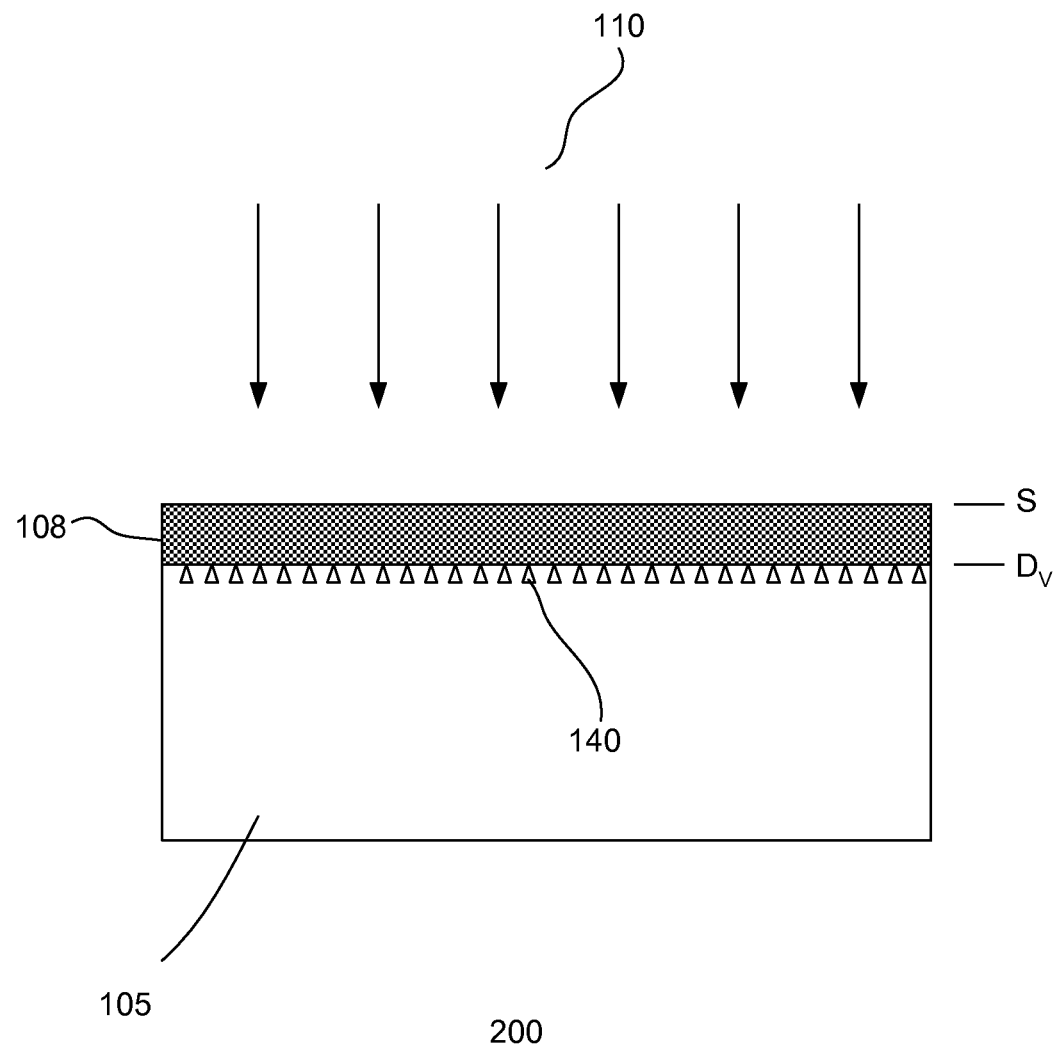
FIGS. 2a-e show an embodiment of a process for forming a device.

FIGS. 2a-e show cross-sectional views of an embodiment of a process for forming a device 200. Referring to FIG. 2a, a substrate 105 is provided. The substrate, in one embodiment, is a silicon substrate. The substrate may be a doped substrate, such as a p$^-$ substrate. Other types of substrates, such as a germanium-based, gallium arsenide, COI such as SOI, or sapphire, may also be useful. The substrate may be doped with other types of dopants or dopant concentrations.

As shown in FIG. 2a, the substrate represents a contact region 110. The contact region, for example, may be a source/drain region of a device, such as a transistor. Other types of contact regions may also be useful. The device may be disposed in a device region of the substrate. It is understood that that the substrate may include other portions of the device.

The contact region of the substrate is processed to form vacancies 140. The substrate, in one embodiment, is irradiated with electromagnetic radiation to form vacancies. Processing the substrate with other techniques to form vacancies may also be useful. In one embodiment, the substrate is irradiated with electromagnetic radiation from a laser to form the vacancies. For example, excimer lasers, such as KrF or XeCl, may be employed. The laser may generate pulses in a wavelength of about 126-351 nm. Other types of laser sources may also be used to form the vacancies. For example, the laser should be able to melt the substrate's top surface instantaneously and facilitates rapid recrystallization quenching rate to induce the formation of vacancy defects. In one embodiment, the spot size of the laser exposure is in the dimensions of micrometers. Other spot size dimensions may also be useful.

The laser melts and facilitates recrystallization of a surface portion of the melted layer of the substrate, forming a recrystallized melted layer 108. Vacancies are formed at the solid/liquid interface between the solid substrate and recrystallized melted layer, which is the maximum depth of the melted layer. The vacancies can be formed by applying one or multiple pulses of laser. The higher the number of laser pulses, the higher the concentration of vacancies. The maximum melt depth is equal to about $D_V$. The maximum melt depth, for example, depends on the technology node and the laser fluence.

The desired maximum melt depth may be controlled by selecting the appropriate laser energy with which to irradiate the substrate. In one embodiment, the desired maximum melt depth may be controlled by selecting the appropriate laser fluence with which the substrate is irradiated. The fluence of the laser is equal to the energy/area. The fluence required to produce the desired maximum melt depth may depend on, for ecample, the material of the substrate.

Figure 10:
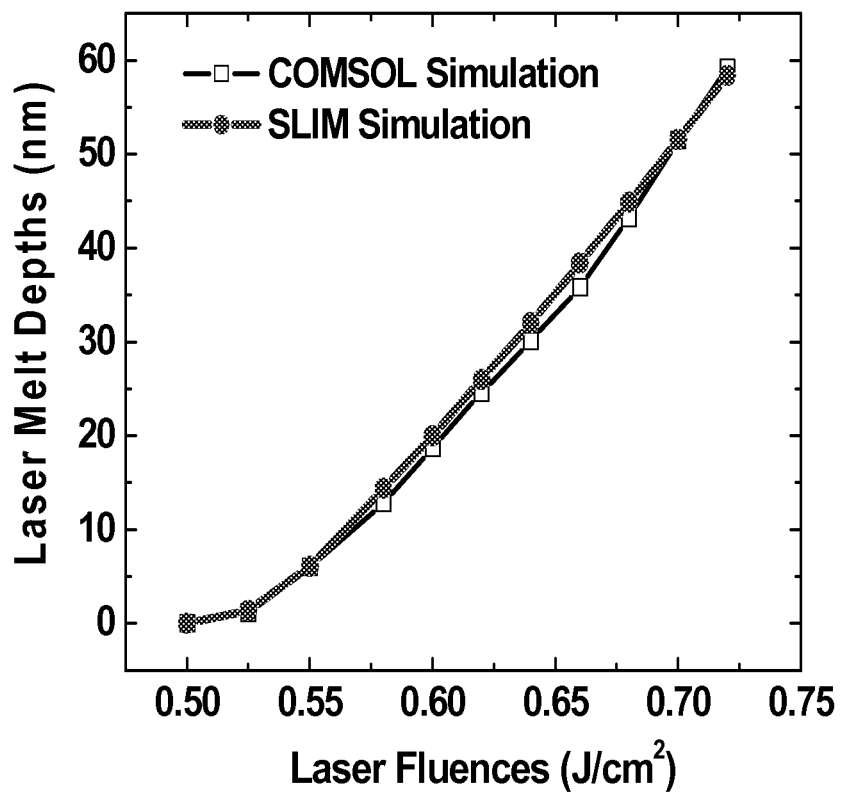
FIG. 10 shows a simulation of laser irradiation on a substrate.

FIG. 10 shows different simulation results correlating melt depth of a silicon substrate as a function of laser fluence using COMSOL and SLIM platforms. From the simulation results, the melt threshold to melt silicon is about 0.52 J/cm$^2$. Below 0.52 J/cm$^2$, the silicon substrate remains solid. The melt depth is directly related to the magnitude of fluence above the melt threshold. For example, the greater the magnitude of fluence above the melt threshold, the deeper the melt depth.

In one embodiment, the contact region of the substrate is selectively irradiated with a laser. A masking layer (not shown) may be used to facilitate selectively irradiating the contact region. The masking layer, for example, may be a mask layer having optical reflective properties to reflect the electromagnetic radiation of the laser. The masking layer, for example, may be a dielectric layer having optical reflective properties to reflect the electromagnetic radiation of the laser. Other types of masking layers may also be used. An opening may be provided in the masking layer to allow the radiation of the laser to pass through.

In other embodiments, the masking layer is formed of a material which possesses variable reflectivity characteristics. For example, the masking layer may have different reflectivity characteristics depending on thickness. This enables the layer's reflectivity characteristics to be modulated by varying its thickness. In one embodiment, the masking layer is a silicon nitride layer. In some embodiments, the masking layer may be silicon oxide. Other types of layers whose reflectivity can be modulated by varying the thickness may also be useful. In other embodiments, different materials may be used in the different regions to achieve the desired reflectivity characteristics.

In one embodiment, the masking layer has a first thickness which reflects laser radiation and a second thickness which absorbs laser radiation. For example, the first thickness is equal to a thickness in which the layer exhibits maximum reflection of laser radiation and the second thickness is equal to a thickness in which the layer exhibits maximum absorption of laser radiation. Other configurations of thicknesses of the masking layer may also be useful. The masking layer is provided with a first thickness in the non-contact region and with a second thickness in the contact region. To produce a masking layer having different thicknesses can be achieved by depositing the layer to have a first thickness and patterning the layer to produce a second thickness in selected areas using, for example, a photoresist mask. Other techniques for producing a masking layer having different thicknesses may also be useful.

Figure 11:
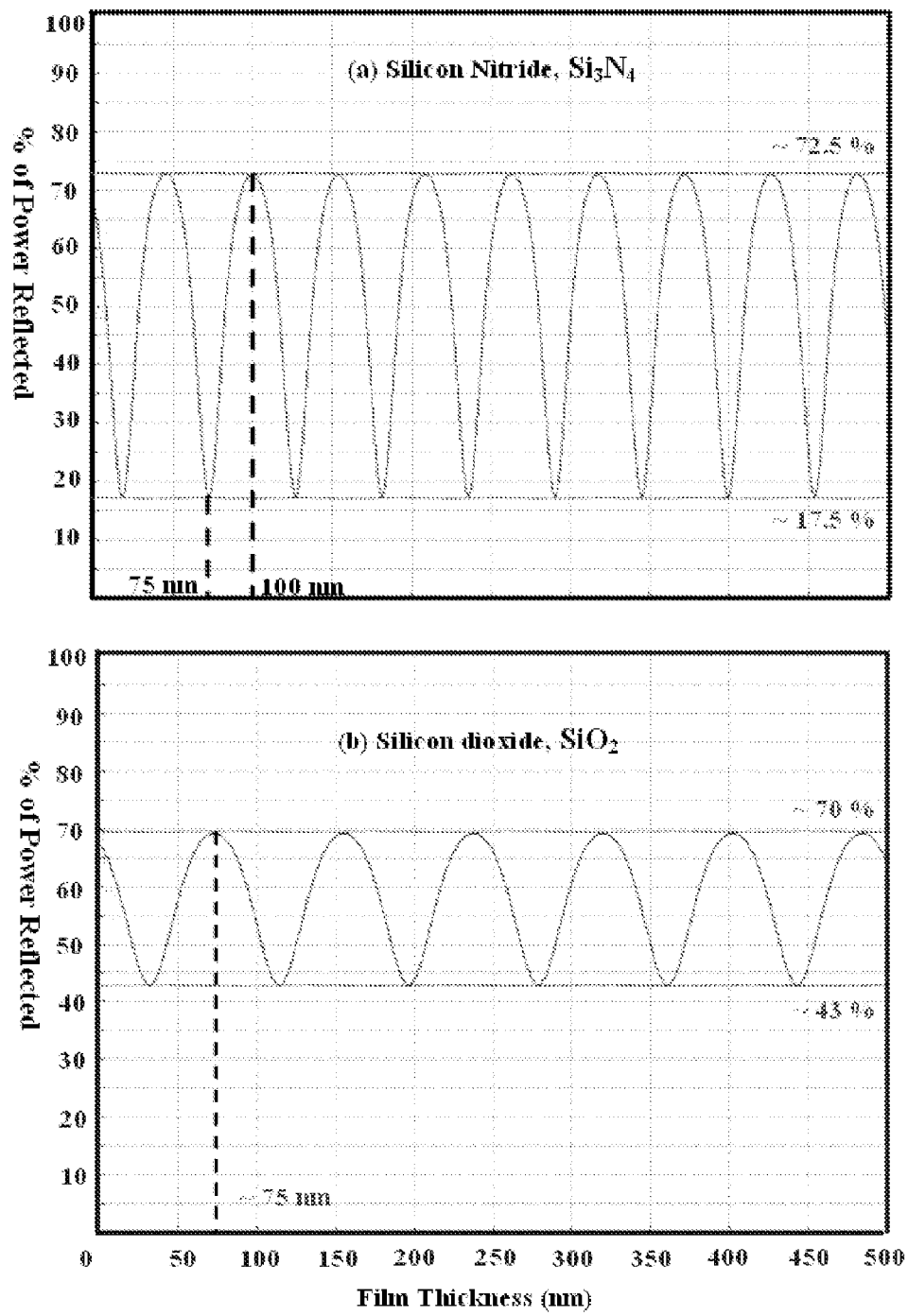
FIG. 11a-b show simulation results of using $Si_3N_4$ and $SiO_2$ respectively as a masking layer.

FIGS. 11a-b show reflectivity characteristics of silicon nitride and silicon oxide, respectively, based on thickness. As can be seen, the thickness of silicon nitride can be modulated to produce a reflectivity from about 17.5%-72.5% while silicon oxide can be modulated to produce a reflectivity from about 43% to 70%. For example, in the case of silicon nitride, the non-contact region may be about 100 nm for maximum reflectivity and about 75 nm for minimum reflectivity (or maximum absorption). Providing the masking layer with other thicknesses in the different regions may also be useful to result in different reflectivity characteristics to enable a first portion to be un-melted while the second portion to be melted.

In some cases, the masking layer over the contact region may be completely removed to have zero reflectivity. This would produce the greatest reflectivity differential between contact and non-contact regions.

Figure 2B:
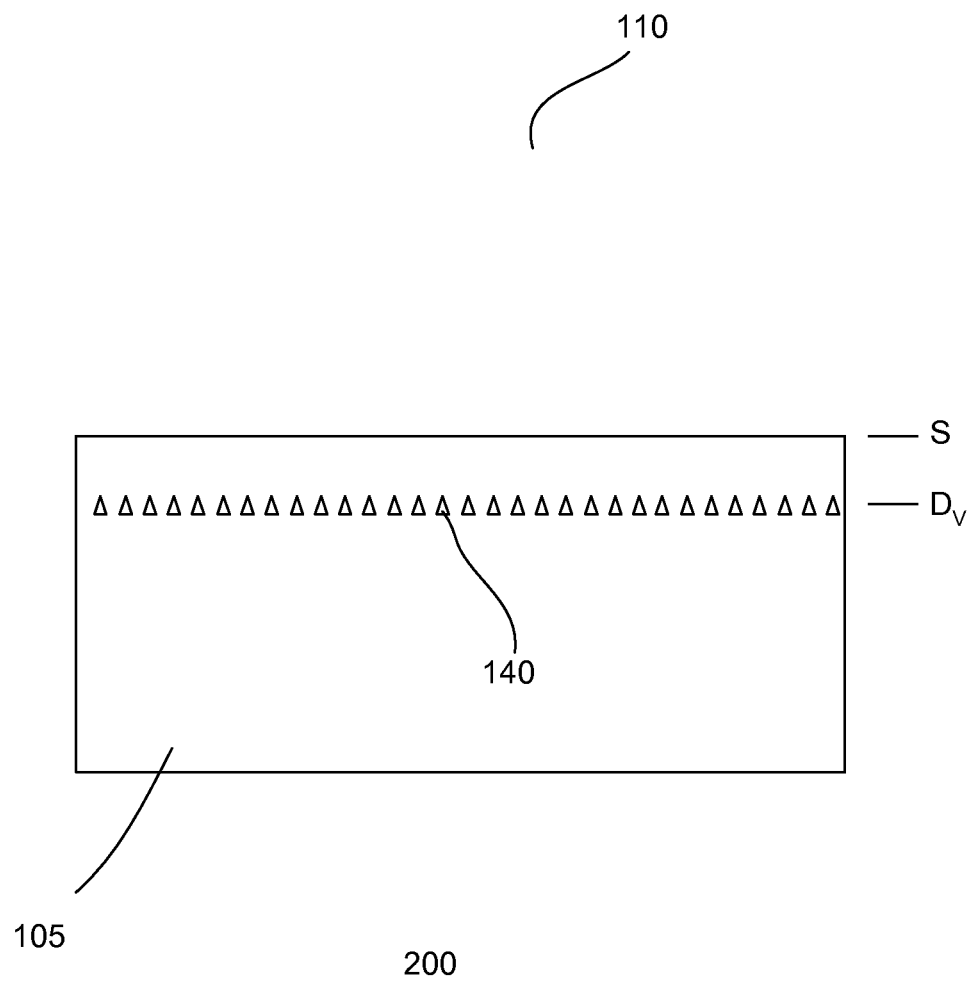

In FIG. 2b, the melt layer solidifies when laser irradiation stops, leaving a peak concentration of vacancies in the substrate at the depth $D_V$. In one embodiment, the laser anneal soak time is in the order of nanoseconds. For example, the portion of the substrate which is exposed to the laser annealing is melted within in the order of nanoseconds. As such, the substrate is melted only in the order of nanoseconds. Once the laser irradiation stops, the substrate cools down almost immediately. This rapid quenching cooling effect instantaneously freezes all diffusion and substrate repair activities. As such, the substrate has a high resolidification or rapid quenching rate, resulting in a high build up of vacancy defects at $D_V$.

Figure 2C:
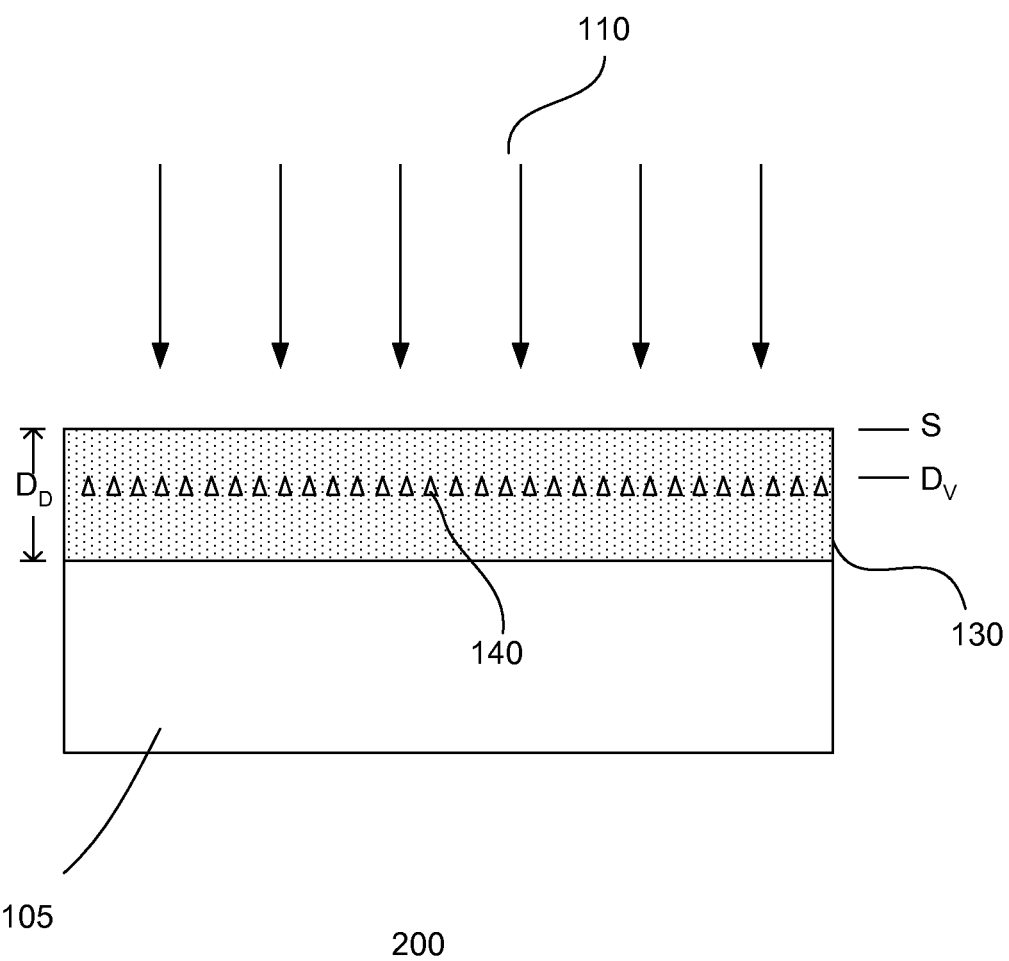

The substrate is implanted with first polarity type dopants to form a doped contact region 130, as shown in FIG. 2c. In one embodiment, the substrate is selectively implanted with first polarity type dopants to form the doped contact region. The doped contact region has a depth $D_D$ from the surface S of the substrate. In one embodiment, $D_D$ is deeper than $D_V$. The depths of $D_D$ and $D_V$ may be in the range of nanometers to micrometers. The depth, for example, may depend on the technology node. Providing $D_D$ which is of other depths relative to $D_V$ may also be useful.

To form the doped contact region, an implant mask (not shown) may be used. The implant mask may expose the contact region while covering other regions of the substrate. The implant mask, for example, is a photoresist layer patterned by a lithographic mask. To improve lithographic resolution, an anti-reflective coating (ARC) may be provided beneath the photoresist layer. Dopants are implanted into the substrate using the implant mask. The dopants are implanted with the appropriate dose and power. In some embodiments, the implant may be a self-aligned implant, obviating the need for a mask. Other configurations of mask techniques to form the doped region may also be useful.

The doped contact region forms a junction at, for example, about $D_D$. The junction, for example, is located at the interface of the doped contact region or $D_D$ and the substrate. The junction may be a first/second polarity type junction. For example, the doped contact region forms a PN junction with the substrate. The PN junction may be formed by providing a substrate with a second polarity type doped substrate region. The second polarity type doped region may be a doped well. The doped well may, for example, serve as a body well of a transistor. Other purposes for the doped well may also be useful. For example, the doped well may be well of a junction varactor. Alternatively, the doped well may be part of a triple or multiple well structure.

In one embodiment, the second polarity type doped substrate region may be a n-type doped substrate region. The n-type doped substrate region may include dopants such as arsenic (As) or phosphorous (P). The doped well, for example, is lightly doped with second polarity type in the concentration of ≤10$^{17}$ atoms/cm$^3$. Providing a doped substrate region with other dopant types, such as a p-type substrate region, or dopant concentrations may also be useful. In other embodiments, the doped substrate region may be a doped substrate, such as a lightly doped substrate. Other types of doped substrates may also be useful.

The doped well or doped substrate, in one embodiment, exists prior to forming the doped contact region. For the case of a doped well, an ion implantation may be performed. The ion implantation may implant appropriate dopants, dose and energy to form the doped well. An implant mask, such as a photoresist mask, may be employed to form the doped well.

An anneal is performed to activate the dopants. In one embodiment, the anneal is performed after the implantation of the dopants. The anneal, for example, is performed at a temperature of about 1000° C. Performing the anneal at other temperatures may also be useful. During the anneal, the vacancies will combine with the dopants. This results in the desired pile-up at $D_V$ after the anneal, as shown in FIG. 2d.

Figure 2D:
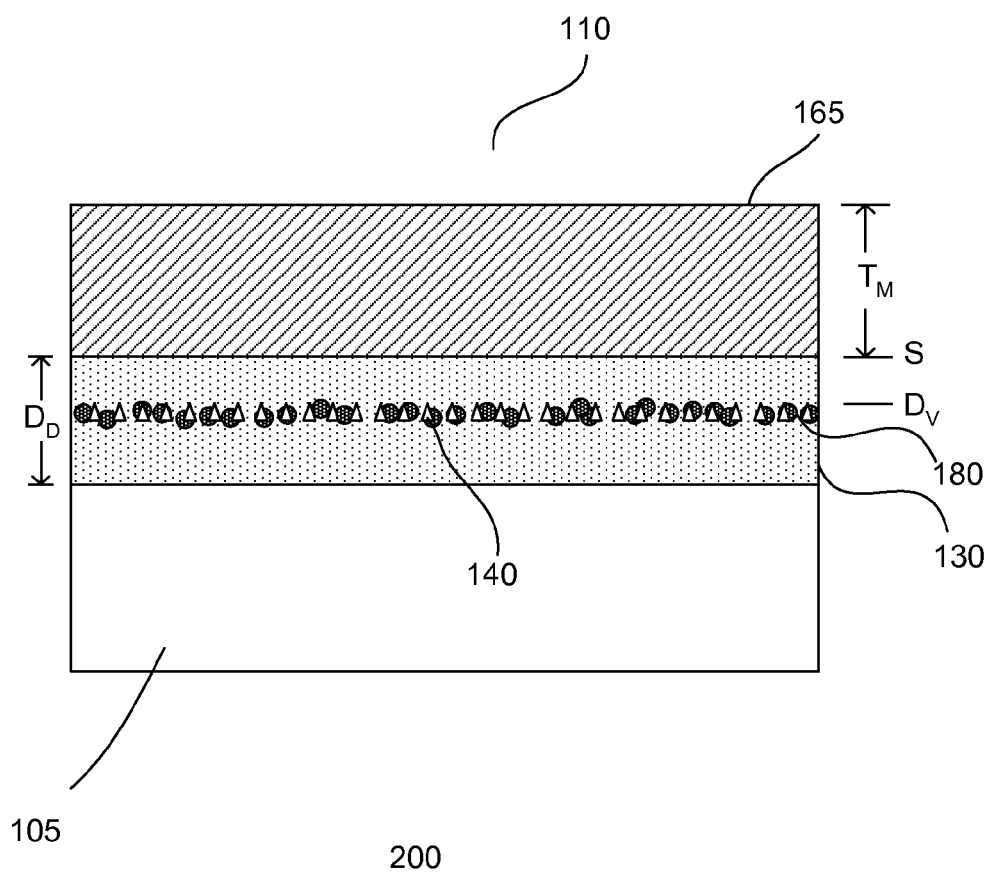

Referring to FIG. 2d, a metal layer 165 is formed on the substrate. The metal layer, for example, is a nickel or nickel alloy layer. Other types of metal materials, such as titanium, cobalt, or other metals or alloys thereof, including nickel, may be used for the metal layer. The metal layer, for example, may be formed by sputtering. Other techniques for forming the metal layer, such as PVD, CVD, e-beam evaporation, etc. may also be useful.

The metal layer is formed with a thickness $T_M$. The thickness $T_M$, for example, can be deduced by obtaining the substrate consumption rate of the particular metal used. The thickness, in one embodiment, should be sufficient to form a metal based contact having a depth equal to about $D_V$. The thickness of the deposited metal layer can be equal to the thickness to be fully consumed during the thermal process to form a metal based contact such that the depth of the metal based contact is equal to about $D_V$.

The consumption of substrate material during the thermal process may depend on the material of the metal layer and substrate. For example, in the case of a nickel metal layer and a silicon substrate, x nm of nickel is used to react with 1.84x nm of silicon to form 2.22x nm of nickel silicide. For example. to form 40 nm of nickel silicide (NiSi) to coincide with about the vacancy depth $D_V$, 21.74 nm of nickel contact layer is required to react with the silicon substrate. For cobalt silicide ($CoSi_2$), x nm of Co is used to react with 3.6x of Si or in the case of titanium silicide ($TiSi_2$), x nm of Ti is used to react with 2.3x of Si.

Figure 2E:
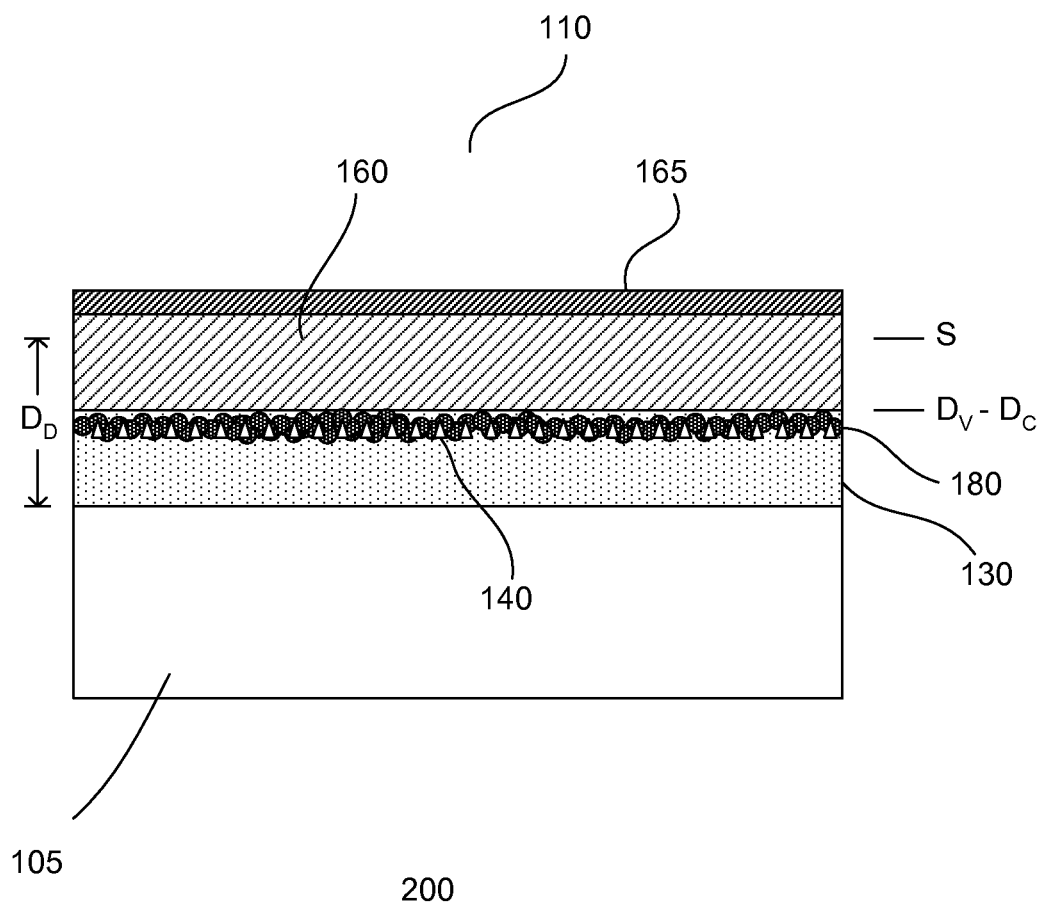

In FIG. 2e, the substrate is processed to form a metal based contact 160. The process, for example, is a thermal process which causes a reaction with the substrate material and metal layer to form the metal based contact. The thermal process, for example, is a silicidation process, in the case of a metal silicide contact. The thermal process, in one embodiment, is performed at a temperature of about 450 to 550° C. for about 60 s for Ni. Performing the thermal process at other temperatures or durations may also be useful. For example, the temperature and duration may depend on the material of the metal layer and substrate.

The thermal process may fully consume the metal layer to form a metal based contact 160 having a contact depth $D_C$ equal to about $D_V$. In other embodiments, the thermal process forms a metal based contact having a contact depth $D_C$ without fully consuming the metal layer. This leaves a portion of the metal layer 165 above the metal based contact 160. The thermal process forms, for example, a metal silicide contact in the case of a silicon substrate. Forming other types of metal based contacts is also useful, depending on the metal layer and substrate material. For example, a nickel germanocide contact may be formed from a nickel metal layer and a germanium substrate.

During the thermal process, dopants of the doped contact region diffuse to the substrate below due to low solubility limit of the metal based contact. This results in high concentrations of dopants 180 piling up (dopant pile up) at the crystal/metal based contact interface (e.g., $D_V$ or $D_C$) wherein the vacancies are disposed. For example, the dopants pile up is located at about the silicon/silicide interface for a silicon substrate. The vacancies enhance activation of the dopants in the dopant pile up. Furthermore, the vacancies act as a diffusion barrier against the downward diffusion of dopants deeper into the substrate, trapping more dopants at the crystal/metal based contact interface. The enhanced activation and/or barrier properties against the downward diffusion of dopants, resulting in dopant pile-up at the interface which leads to reducing contact resistance as discussed earlier.

After forming the contact, excess unreacted metal is removed. Removal of excess unreacted metal can be achieved by, for example, wet etch. This leaves the metal based contact over the doped contact region.

The process further continues to form the device. For example, the process continues to form a dielectric layer. The dielectric layer may be a pre-metal dielectric (PMD) layer. Contacts to the metal based contacts may be formed in the device. Additional processes may include forming of one or more interconnect levels, final passivation, dicing, assembly, packaging and testing. Other processes are also useful. For example, other components, such as low voltage, medium voltage, and high voltage I/O devices can be formed prior to forming the interconnections.

Figure 3A:
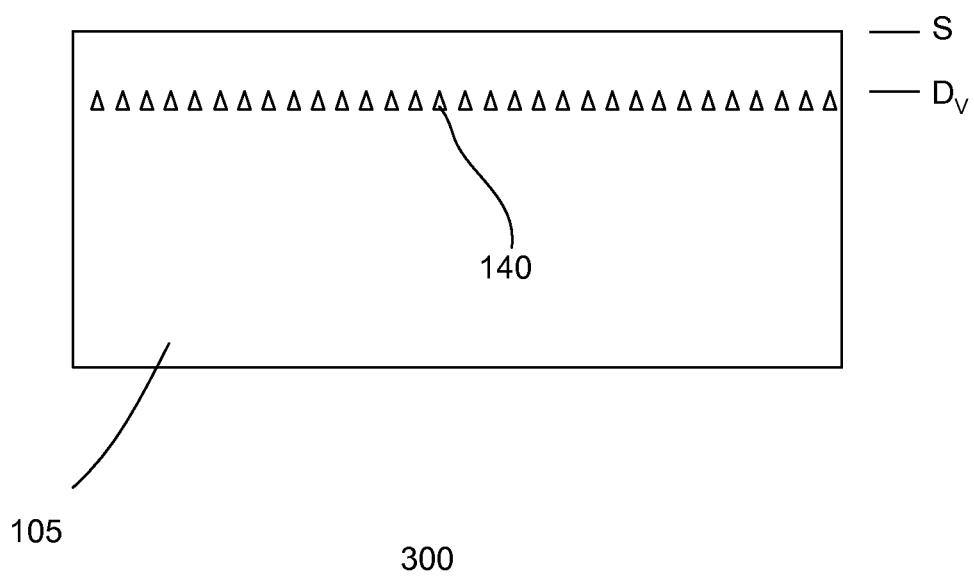
FIGS. 3a-d show an alternative process of forming a device.

FIGS. 3a-d show cross-sectional views of another embodiment of a process for forming a device 300. The process may be similar to the process described in FIGS. 2a-e. Common elements of the processes may not be described or described in detail. Referring to FIG. 3a, a substrate 105 is provided. The substrate is at a stage of processing as described in FIG. 2b. The substrate, in one embodiment, is a silicon substrate. The substrate may be a doped substrate, such as a p⁻ substrate. Other types of substrates, such as a germanium-based, gallium arsenide, COI such as SOI, or sapphire, may also be useful. The substrates may be doped with other types of dopants or dopant concentrations.

Figure 3B:
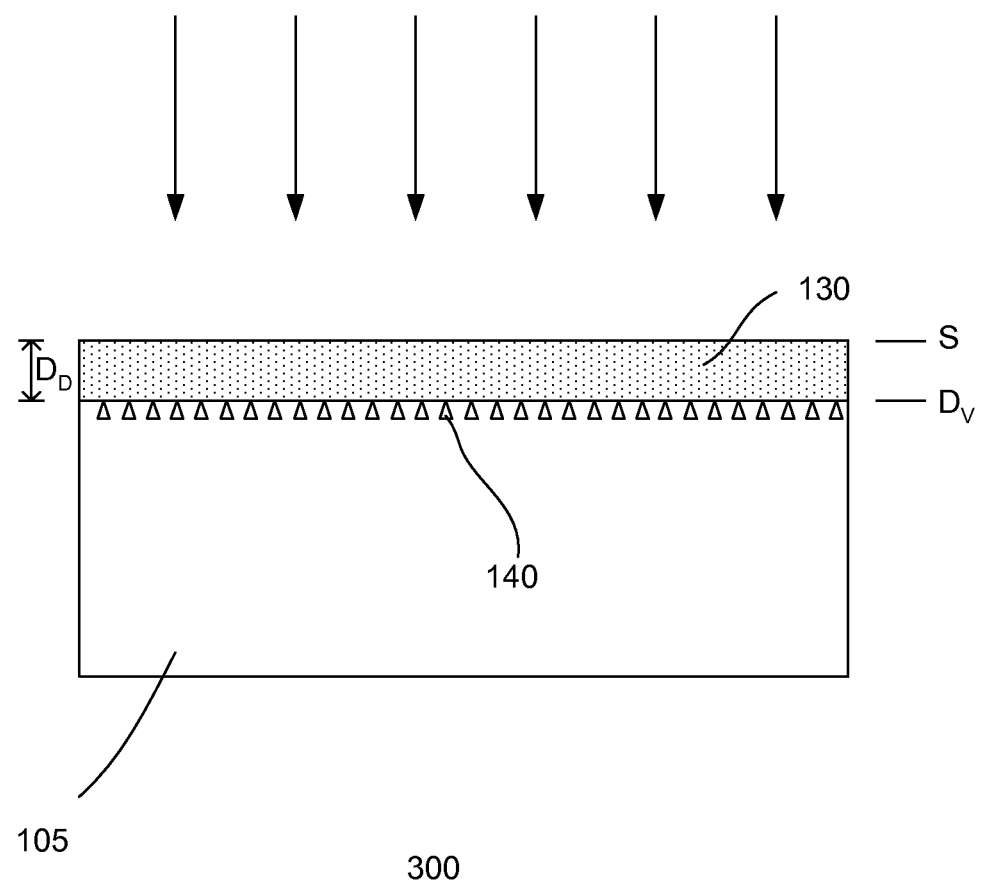

In FIG. 3b, the substrate is implanted with first polarity type dopants to form a doped contact region 130. In one embodiment, the substrate is selectively implanted with first polarity type dopants to form the doped contact region, similar to that described in FIG. 2c. The doped contact region has a depth $D_D$ from the surface S of the substrate. In one embodiment, $D_D$ is equal to about $D_V$. For example, $D_D$ and $D_V$ may be in the range of nanometers to micrometers. The depth, for example, depends on the technology node. Other depths for $D_D$ and $D_V$ may also be useful.

To form the doped contact region, an implant mask (not shown) may be used. The implant mask may expose the contact region while covering other regions of the substrate. The implant mask, for example, is a photoresist layer patterned by a lithographic mask. To improve lithographic resolution, an anti-reflective coating (ARC) may be provided beneath the photoresist layer. Dopants are implanted into the substrate using the implant mask. The dopants are implanted with the appropriate dose and power. In some embodiments, the implant may be a self-aligned implant, obviating the need for a mask. Other configurations of mask techniques to form the doped region may also be useful.

The doped contact region forms a junction at, for example, about $D_D$. The junction, for example, is located at the interface of the doped contact region or $D_D$ and the substrate. The junction may be a first/second polarity type junction. For example, the doped contact region forms a PN junction with the substrate. The PN junction may be formed by providing a substrate with a second polarity type doped substrate region. The second polarity type doped region may be a doped well. The doped well may, for example, serve as a body well of a transistor. Other purposes for the doped well may also be useful. For example, the doped well may be well of a junction varactor. Alternatively, the doped well may be part of a triple or multiple well structure. In one embodiment, the second polarity type doped substrate region may be a n-type doped substrate region. The n-type doped substrate region may include dopants such as arsenic (As) or phosphorous (P). The doped well, for example, is lightly doped with second polarity type in the concentration of $\leq 10^{17}$ atoms/cm³. Providing a doped substrate region with other dopant types, such as a p-type substrate region, or dopant concentrations may also be useful. In other embodiments, the doped substrate region may be a doped substrate, such as a lightly doped substrate. Other types of doped substrates may also be useful.

The doped well or doped substrate, in one embodiment, exists prior to forming the doped contact region. For the case of a doped well, an ion implantation may be performed. The ion implantation may implant appropriate dopants, dose and energy to form the doped well. An implant mask, such as a photoresist mask, may be employed to form the doped well.

An anneal is performed to activate the dopants. In one embodiment, the anneal is performed after the implantation of the dopants. The anneal, for example, is performed at a temperature of about 1000° C. Performing the anneal at other temperatures may also be useful. During the anneal, the vacancies will combine with the dopants. This results in the desired dopant pile-up 180 at $D_V$ after the anneal as shown in FIG. 3c.

Figure 3C:
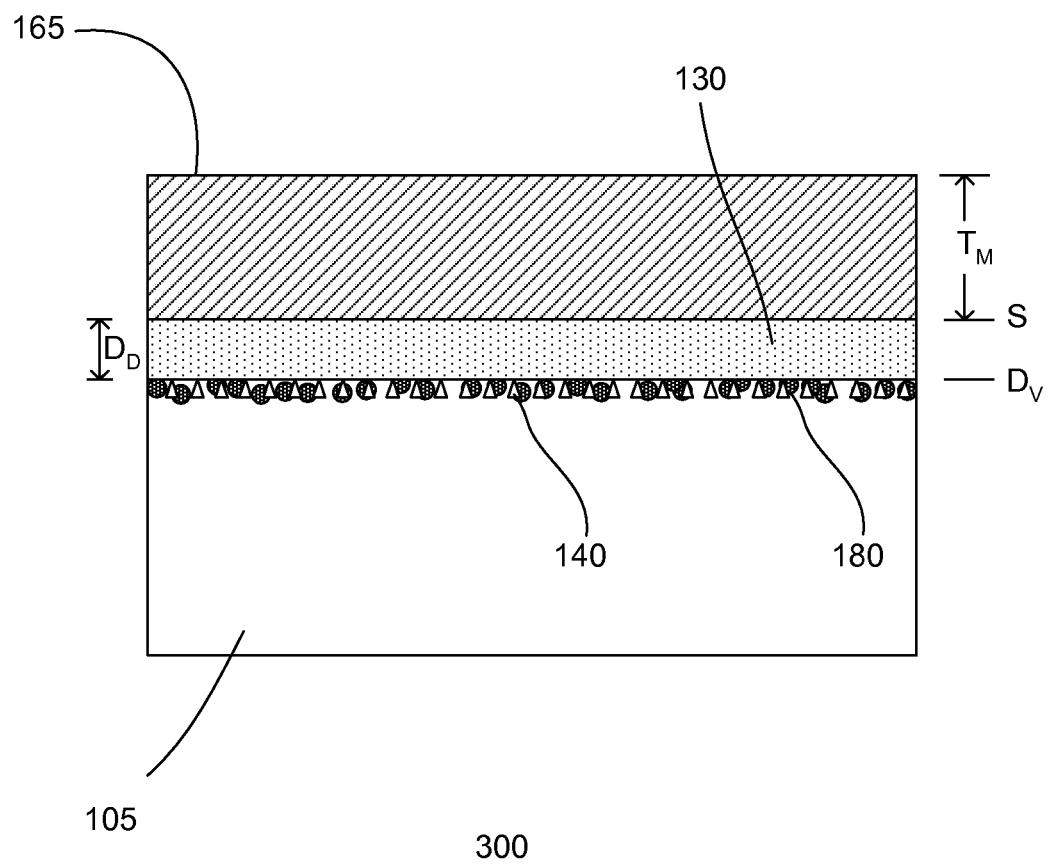

Referring to FIG. 3c, a metal layer 165 is formed on the substrate. The metal layer, for example, is formed as described in FIG. 2d. For example, the metal layer may be a nickel or nickel alloy layer. Other types of metal materials, such as titanium, cobalt, or other metals or alloys thereof, including nickel, may be used for the metal layer.

The metal layer is formed with a thickness $T_M$. The thickness $T_M$, for example, can be deduced by obtaining the substrate consumption rate of the particular metal used. The thickness, in one embodiment, should be sufficient to form a metal based contact having a depth equal to about $D_V$. The thickness of the deposited metal layer can be equal to the thickness to be fully consumed during the thermal process to form a metal based contact such that the depth of the metal based contact is equal to about $D_V$.

The consumption of substrate material during the thermal process may depend on the material of the metal layer and substrate. For example, in the case of a nickel metal layer and a silicon substrate, x nm of nickel is used to react with 1.84x nm of silicon to form 2.22x nm of nickel silicide. For example, to form 40 nm of nickel silicide (NiSi) to coincide with about the vacancy depth $D_V$, 21.74 nm of nickel contact layer is required to react with the silicon substrate. For cobalt silicide ($CoSi_2$), x nm of Co is used to react with 3.6x of Si or in the case of titanium silicide ($TiSi_2$), x nm of Ti is used to react with 2.3x of Si.

Figure 3D:
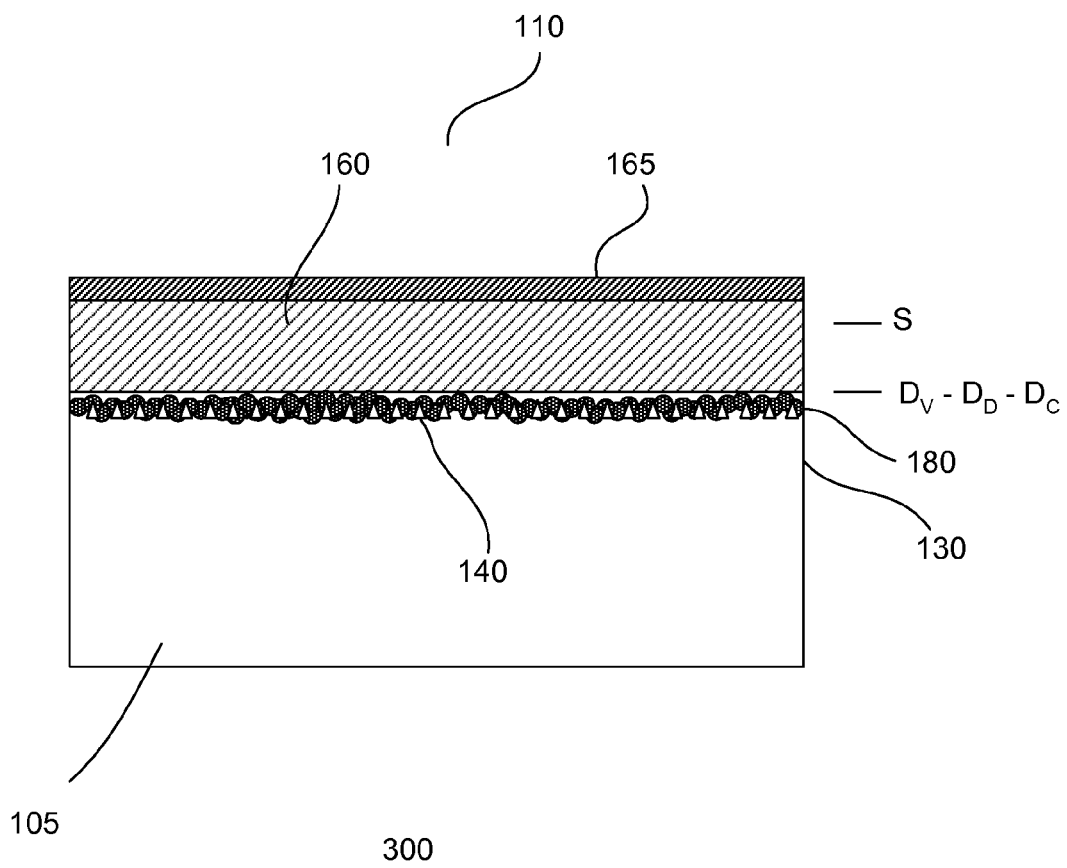

In FIG. 3d, the substrate is processed to form a metal based contact 160, as described in FIG. 2e. The process, for example, is a thermal process which causes a reaction with the substrate material and metal layer to form the metal based contact. The thermal process, for example, is a silicidation process, in the case of a metal silicide contact. The thermal process, in one embodiment, is performed at a temperature of about 450 to 550° C. for about 60 s of anneal for Ni. Performing the thermal process at other temperatures may also be useful. For example, the temperature may depend on the material of the metal layer and substrate.

The thermal process may fully consume the metal layer to form a metal based contact 160 having a contact depth $D_C$ equal to about $D_V$. In other embodiments, the thermal process forms a metal based contact having a contact depth $D_C$ without fully consuming the metal layer. This leaves a portion of the metal layer 165 above the metal based contact 160. The thermal process forms, for example, a metal silicide contact in the case of a silicon substrate. Forming other types of metal based contacts is also useful, depending on the metal layer and substrate material. For example, a nickel germanocide contact may be formed for a nickel metal layer and a germanium substrate.

During the thermal process, dopants of the doped contact region diffuse to the substrate below due to low solubility limit of the metal based contact. This results in high concentrations of dopants 180 piling up (dopant pile up) at the crystal/metal based contact interface (e.g., $D_V$ or $D_C$) where in the vacancies are disposed. For example, the dopants pile up is located at about the silicon/silicide interface for a silicon substrate. The vacancies enhance activation of the dopants in the dopant pile up. Furthermore, the vacancies act as a diffusion barrier against the downward diffusion of dopants deeper into the substrate, trapping more dopants at the crystal/metal based contact interface. The enhanced activation and/or barrier properties against the downward diffusion of dopants, resulting in dopant pile-up at the interface which leads to reducing contact resistance.

After forming the contact, excess unreacted metal is removed. Removal of excess unreacted metal can be achieved by, for example, wet etch. This leaves the metal based contact over the doped contact region. The process continues to form the device, for example, as previously described.

FIG. 4 shows a cross-sectional view of an embodiment of a portion of a device 400. The device, for example, is an integrated circuit (IC). Other types of devices may also be useful. As shown, the device includes a substrate 105. The substrate, for example, is a silicon substrate. Other types of substrates, such as silicon germanium, germanium, gallium arsenide, or crystal-on-insulator (COI) such as silicon-on-insulator (SOI), are also useful. The substrate maybe a doped substrate. For example, the substrate can be lightly doped with p-type dopants. Providing a substrate with other types of dopants or concentrations, including no dopants, may also be useful.

The substrate includes a device region. The device region, for example, is a device region for a transistor 420. Although the substrate shown with one device region, it is understood that the substrate includes other device regions for other types of devices. Depending on the type of IC, the substrate may include device regions for high voltage (HV) devices, intermediate voltage (IV) devices and low voltage (LV) devices. In some embodiments, memory array regions and/or logic regions may be provided. Other device regions may also be included on the substrate.

A device isolation region 490 may be provided for isolating the device region from other regions of the substrate. For example, the device isolation region surrounds the device region. The isolation region, for example, is a shallow trench isolation (STI) region. Other types of isolation regions may also be employed. For example, the isolation region may be a deep trench isolation (DTI) region. The STI regions, for example, extend to a depth of about 2000-5000 Å. In the case of DTI regions, the depth may be about 1-10 μm. Providing isolation regions which extend to other depths may also be useful. The depth of the isolation regions, for example, depends on design requirements and technology node. For example, the depth of the isolation region may be about 0.09-0.11 μm for the 65 nm technology node.

In one embodiment, a device well 410 is disposed in the substrate. The device well, for example, is disposed within the device isolation region. In one embodiment, the depth or bottom of the device well is below the device isolation region.

The device well includes second polarity type dopants for a first polarity type device. For example, the device well may have n-type dopants for a p-type device or p-type dopants for a n-type device. The device well may be lightly (x⁻) or intermediately (x) doped with second polarity type dopants. Other dopant concentration for the device well may also be useful. For example, the dopant concentration may depend on the voltage requirement of the device.

The transistor includes a gate 470 on the surface of the substrate. The gate, for example, includes a gate electrode 476 over a gate dielectric 472. The gate dielectric, for example, may be silicon oxide while the gate electrode may be polysilicon. The gate dielectric, for example, may have a thickness in the order of about a few nanometers while the gate electrode may be in the order of about a few hundred Å, for example about 500-1000 Å thick. In some embodiments, the gate electrode may be a doped electrode. For example, the gate electrode may be polysilicon doped with first polarity type dopants to lower the poly gate resistance. Other types of gate dielectrics and gate electrodes as well as thicknesses may also be useful. For example, the gate dielectric may be a high k gate dielectric and the gate electrode may be a metal gate electrode. Other configurations of gate layers of the gate may also be useful.

The transistor also includes first and second doped regions 430 in the substrate on first and second sides of the gate. For example, the first and second doped regions are disposed on first and second sides of gate. The doped regions, for example, are source/drain regions of the transistor. The doped regions, in one embodiment, are heavily doped with first polarity type dopants for a first type transistor. For example, the doped regions are heavily doped p-type (p⁺) regions for a p-type transistor. Providing heavily doped n-type (n⁺) regions may also be useful for a p-type transistor. The heavily doped regions, for example, have a dopant concentration of about >$10^{20}$ atoms/cm³. Other dopant concentrations for the doped regions may also be useful. The depth of the doped regions may depend on, for example, the technology node. Generally, the depth of the doped regions is shallower than the depth of the STI. For example, the depth of the doped regions is in the order of about tens to hundreds of Å for small devices and a few hundred Å for bigger devices. Providing doped regions having other depths may also be useful. Additionally, it is not necessary that the first and second doped regions have the same depth. The substrate beneath the gate between the doped regions, in one embodiment, forms a channel 426 of the transistor.

In one embodiment, the doped regions include a lightly doped (LD) region 434 and a heavily doped (HD) region 436. The LD region, for example, underlaps the gate. The depths of the LD and the HD regions, for example, depend on the technology node.

Sidewalls of the gate may be provided with dielectric spacers 481. The dielectric spacers, for example, may be silicon oxide spacers. Other types of dielectric materials may also be useful, such as silicon nitride or a combination of dielectric materials or layers. For example, the spacers may be composite spacers. The spacers may include an offset spacer 482 and a main spacer 484. The offset spacers may facilitate forming the LD regions while the main spacers facilitate forming the HD regions. Other configurations of spacers may also be useful. For example, the spacer may be a single spacer. The LD regions, for example, are formed after forming the offset spacers while the HD regions are formed after the main spacers. In some cases, the transistor may also include halo regions. Halo regions are second polarity doped regions abutting the S/D regions proximate to the gate.

In some embodiments, a dielectric etch stop layer (not shown) is formed over the transistors. The etch stop layer, for example, is a silicon nitride etch stop layer. Other types of etch stop layers may also be useful. The etch stop layer should have a material which can be selectively removed from a dielectric layer thereover. The etch stop layer facilitates in forming contact plugs to contact regions of the transistor, such as the gate electrode and doped regions. In some embodiments, the etch stop layer may also serve as a stress layer for applying a stress on the channel of the transistor to improve performance.

The doped regions include vacancy defects 440. The vacancy defects, in one embodiment, are laser induced vacancy defects. For example, vacancies are created by irradiating substrate with electromagnetic radiation from a laser. The laser, for example, may be an excimer laser, such as KrF or XeCl. The laser may generate pulses in a wavelength of about 126-351 nm. Other types of laser sources may also be used to form the vacancies. For example, the laser should be able to melt the substrate's top surface instantaneously and facilitates rapid recrystallization quenching rate to induce the formation of vacancy defects. In one embodiment, the spot size of the laser exposure is in the dimensions of micrometers. Other spot size dimensions may also be useful.

A peak concentration of the laser induced vacancy defects is disposed in the substrate at a depth $D_V$, which is equal to about the maximum laser melt depth. The peak concentration of vacancies, for example, may be about $10^{17}$-$10^{18}$ atm/cm³. Other peak concentrations of vacancies may also be useful. The maximum melt depth can be adjusted to the desired depth by selecting the appropriate laser fluence. In one embodiment, $D_V$ is shallower or less than the depth of the HD regions or $D_D$. $D_V$, for example, may be deeper or shallower than the LD regions. Providing $D_V$ at other depths may also be useful. For example, $D_V$ may be at other depths relative to $D_D$. The depth $D_V$, for example, may depend on the depth of the metal base contact required for the technology node. In one embodiment, $D_V$ is less (shallower) than $D_D$. In other embodiments, $D_D$ is about the same as $D_V$. Such a configuration may be used to form a transistor with Schottky contacts.

Metal based contacts 460 are provided in the doped regions. A metal based contact, in one embodiment, is a combination of the substrate material and a metal. For example, in the case of a silicon substrate, the metal based contact is a metal silicide contact. In the case of a germanium substrate, the metal based contact is a metal germanocide contact. Other types of metal based contacts may also be useful, depending on the substrate material. The contact, for example, may be a nickel or nickel alloy metal-semiconductor crystal contact. Other types of metals may also be useful. For example, metals such as titanium, cobalt, or other metals or alloys thereof, including nickel, may be used for the contacts. In one embodiment, a depth $D_C$ of the metal based contacts is equal to about $D_V$. The top surface of the metal based contacts is above the substrate surface S.

The metal based contacts have a low dopant solubility limit. This low solubility limit causes the first polarity type dopants to segregate out of the doped contact regions where the metal based contacts are disposed. For example, dopants segregate from the doped contact regions where the metal based contact is disposed, resulting in high concentrations of dopants 480 piling up (dopant pile up) at the crystal/metal based contact interface (e.g., $D_V$ or $D_C$) where in the vacancies are disposed. For example, the dopants pile up is located at about the silicon/silicide interface for a silicon substrate. The vacancies enhance activation of the dopants in the dopant pile up. Furthermore, the vacancies act as a diffusion barrier against the downward diffusion of dopants deeper into the substrate, trapping more dopants at the crystal/metal based contact interface. The enhanced activation and/or barrier properties against the downward diffusion of dopants, resulting in dopant pile-up at the interface which leads to reducing contact resistance.

In one embodiment, a metal gate contact 478 is disposed over the gate electrode. The metal gate contact, for example, includes the same metal as the metal based contacts in the doped regions. Forming the metal gate contact using a different material than the contacts in the contact regions is also useful. The metal gate contact is a combination of metal and gate electrode material. For example, the metal gate contact may be a metal silicide gate contact for a polysilicon gate electrode. Other types of metal gate contacts may also be useful.

Figure 5A:
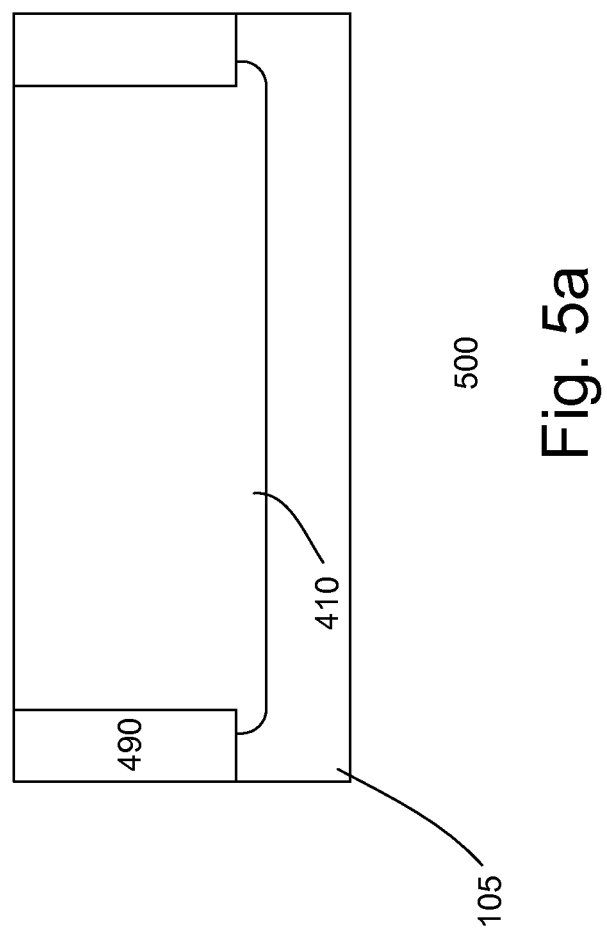

FIGS. 5a-j show cross-sectional views of an embodiment of a process for forming a device 500. Referring to FIG. 5a, a substrate 105 is provided. The substrate, in one embodiment, is a silicon substrate. The substrate may be a doped substrate, such as a p⁻ substrate. Other types of substrates, such as a germanium-based, gallium arsenide, COI such as SOI, or sapphire, may also be useful. The substrates may be doped with other types of dopants or dopant concentrations.

As shown in FIG. 5a, a device region is defined on the substrate. Although one device region is shown, it is however understood that the substrate may include various types of regions (not shown). For example, the substrate may include other device regions for other types of devices. The IC may include logic regions in which logic devices are formed. Depending on the type of IC formed, the logic regions, for example, may include regions for different voltage devices. For example, the logic regions may include regions for HV devices, IV devices and LV devices. Other configurations of logic regions may also be useful. Additionally, other types of device regions may also be provided.

The device region, for example, serves as a device region for a transistor. Providing a device region for other types of devices may also be useful. The device region is separated from other regions by a device isolation region 490. The device isolation region surrounds the device region. The isolation region is, for example, a STI. Various processes can be employed to form the STI region. For example, the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STI. The depth of the STI may be, for example, about 3000-4500 Å. Other depths for the STI may also be useful. The depth, for example, may depend on the technology node. In other embodiments, the isolation may be other types of isolation regions.

In some embodiments, a device doped well 410 is formed in the device region. In one embodiment, the device doped well is formed after forming the STI. The device well serves as a body well for the transistor. The device well includes second polarity type dopants. In one embodiment, the device well is a n-type doped device well. The n-type doped device well may include dopants such as arsenic (As) or phosphorus (P). For example, the dopant concentration of the device well is about $\leq 10^{17}$ atoms/cm³. Other dopant concentrations or dopant types for the device doped well may also be useful. For example, the doped well may be a p-type doped well. The device well, in one embodiment, encompasses the drift well and internal isolation region. In one embodiment, the device well encompasses a portion of the device isolation region, internal isolation region and drift well. The depth of the device well, for example, is about a few hundred nanometers. Other depths for the device well may also be useful.

To form a doped well, an implant mask which exposes the device region is used. The implant mask, for example, includes photoresist patterned by a lithographic mask. Dopants are implanted into the substrate using the implant mask. The dopants are implanted with the appropriate dose and power. Separate implant processes with respective implant masks are used to form doped wells of different polarity types. For example, separate processes are used to form the drift and device wells. In one embodiment, the device well is formed prior to forming the drift well. In some embodiments, a doped well may be formed by, for example, performing multiple implants at different energies. For example, the device well may be formed using multiple implant processes. Other configurations of implant processes may also be employed to form the wells. The device well, for example, extends under the bottom of the device isolation region. Other configurations of the device well may also be useful.

An anneal may be performed after the device well is formed. The anneal serves to activate the dopants in the device well. For example, a high temperature anneal with a low thermal budget and short soak annealing time is performed to activate the dopants with minimal diffusion of dopants. Other annealing parameters and conditions may also be useful. The anneal may be performed at other stages of processing. For example, the anneal may be performed to activate dopants of different type wells at the same time.

Figure 5B:
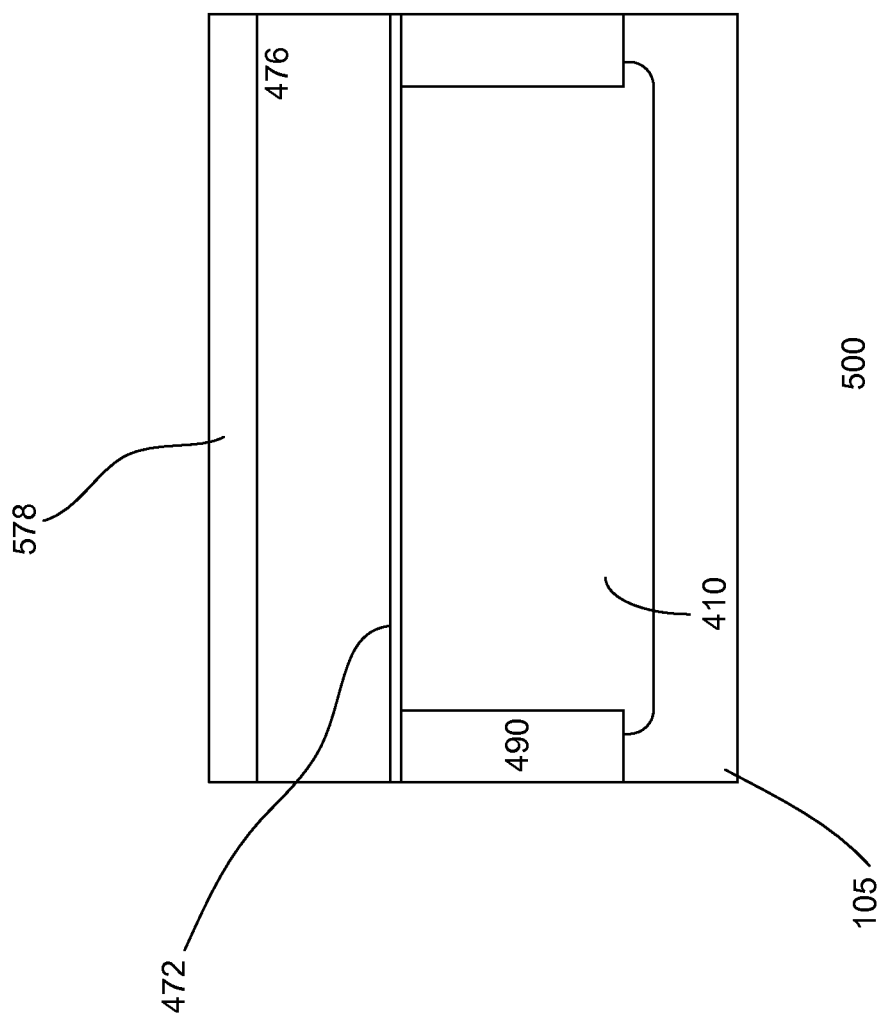

As shown in FIG. 5b, gate layers of a gate are formed on the substrate. In one embodiment, the gate layers include a gate dielectric layer 472 on the substrate and a gate electrode layer 476 thereon. The gate dielectric layer, for example, is silicon oxide. The thickness of the gate dielectric layer may be in the order of about tens to hundreds Å. The gate dielectric layer may be formed by thermal oxidation. For example, the dielectric layer is formed by wet oxidation followed by annealing the substrate in an oxidizing ambient. The temperature of the wet oxidation can be, for example, about 600-1000° C. The annealing can be, for example, performed at a temperature of about 1000° C.

As for the gate electrode layer, it may be polysilicon. The thickness of the gate electrode layer may be about a few hundred Å. Other thickness may also be useful. The gate electrode layer may be formed by, for example, CVD. Other techniques for forming the gate electrode layer may also be useful. The gate electrode layer can be formed as an amorphous or non-amorphous layer. In one embodiment, the gate electrode layer is polysilicon doped with p-type dopants. The concentration of dopants in the gate electrode layer may be about $>10^{20}$ atoms/cm³. In some embodiments, the concentration of dopants in the gate electrode may be about the same as the junction or S/D regions. Various techniques may be employed to dope the gate electrode, for example, in-situ doping or ion implantation.

Other types of gate dielectric and gate electrode materials or thicknesses may also be useful. For example, the gate dielectric material may be a high k dielectric material while the gate electrode may be a metal gate electrode material. Other configuration of gate layers may also be useful. For example, the gate dielectric and/or gate electrode layers may have multiple layers. The layers can be formed by various techniques, such as thermal oxidation, CVD and sputtering.

In one embodiment, a capping layer 578 is formed over the gate electrode. The capping layer, for example, is a dielectric capping layer. In other embodiments, the capping layer may be a non-dielectric capping layer. In one embodiment, the dielectric capping layer may be formed of silicon nitride. Other types of dielectric materials, such as silicon oxide, may also be used to form the capping layer. The capping layer, for example, may be formed by CVD. Other techniques for forming the capping layer may also be useful. In one embodiment, the capping layer facilitates in creating optical reflective properties. For example, the capping layer is combined with a subsequent layer to form a composite layer having optical reflective properties. Providing other thicknesses for the capping layer may also be useful. In some embodiments, the capping layer may have reflective properties by itself. For example, the thickness of the dielectric capping layer may be selected to cause the layer to have optical reflective properties.

Referring to FIG. 5c, the various gate layers, including the capping layer, are patterned to form a gate 470 in the device region. The gate, for example, may be a gate conductor which traverses device regions and serve as a common gate conductor for a plurality of transistors. Other configurations of the gate or gate conductor may also be useful.

Mask and etch techniques may be employed to pattern the gate layers to form the gate. For example, a mask layer, such as photoresist, may be formed over the capping layer and patterned to create openings where the gate layers are to be removed. The patterned mask layer serves as an etch mask. For example, an etch transfers the pattern of the mask to the gate layers. The etch removes the gate layers unprotected by the mask, exposing the substrate. The etch, for example, may be an anisotropic etch, such as reactive ion etch (RIE). Other types of etch processes may also be useful.

In one embodiment, sidewall spacers 482 are formed on sidewalls of the gate, as shown in FIG. 5d. The sidewall spacers, for example, are dielectric sidewall spacers. The sidewall spacers may be silicon oxide. Other types of dielectric materials, such as silicon nitride or oxynitride, may also be useful. The sidewall spacers, for example, are offset spacers used in forming LD regions on sides of the gate. To form the offset spacers, a dielectric layer is deposited on the substrate, covering the device region and gate. The dielectric layer, for example, may be formed by CVD. Forming the dielectric layer using other techniques may also be useful. The thickness of the dielectric layer is equal to about a thickness of the offset spacers to be formed. Other thicknesses for the dielectric layer, depending on the desired thickness of the offset spacers, may also be useful. An anisotropic etch, such as a RIE, may be performed to remove horizontal components of the dielectric layer, leaving offset spacers on sidewalls of the gate.

Figure 5E:
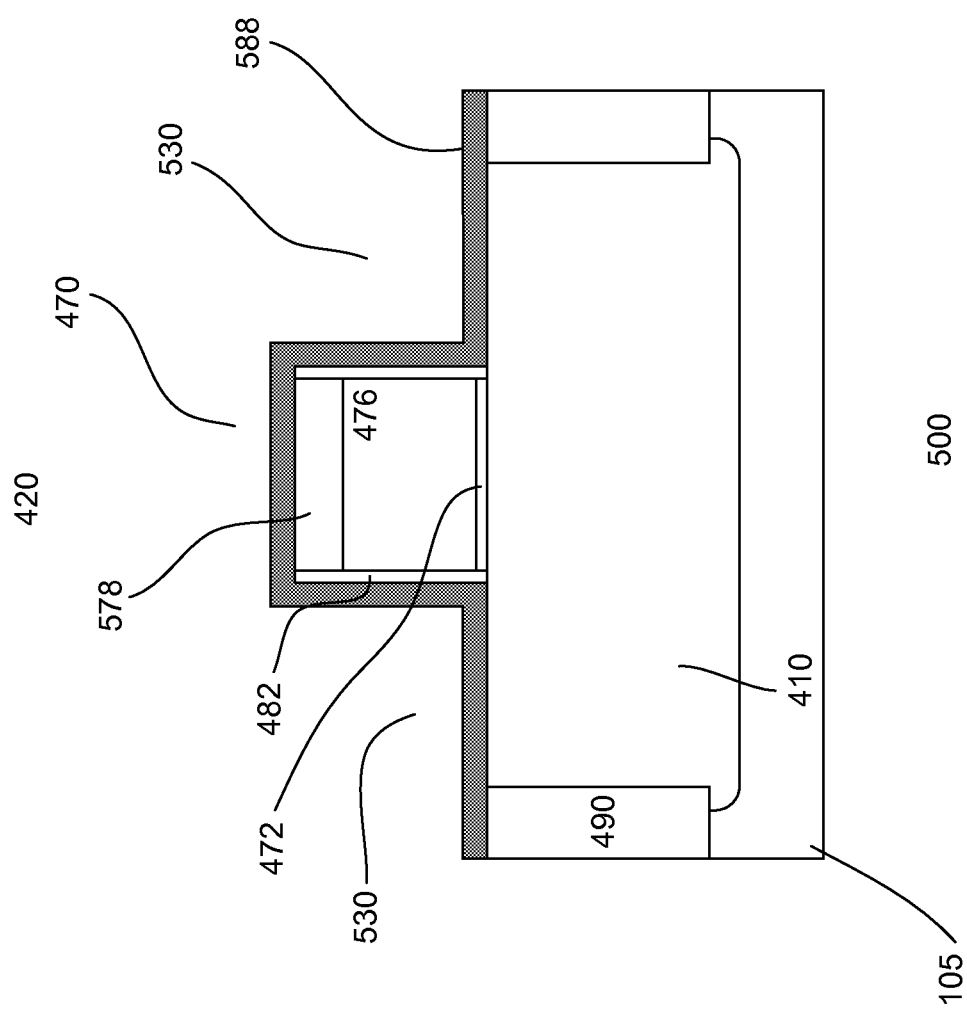

In one embodiment, as shown in FIG. 5e, a liner 588 is deposited over the substrate, covering the gate and device region. For example, the liner covers the gate, source/drain (S/D) regions 530 adjacent to the gate and STI, and the STI. In one embodiment, the liner is a dielectric liner. The dielectric liner, in one embodiment, is silicon nitride. Other types of dielectric liners, such as silicon oxide, may also be useful. The liner may be formed by, for example, CVD. Other techniques for forming the liner layer may also be useful.

In one embodiment, the dielectric liner possesses optical absorptive properties. For example, thickness of the dielectric liner may be selected to impart it with optical absorptive properties. In one embodiment, the thickness of the dielectric liner may be selected to impart it with optical absorptive properties over the S/D regions and optical reflective properties over the gate and isolation regions. For example, the thickness of the dielectric liner in combination with the capping layer and isolation regions result in the optical reflective properties. Providing a dielectric liner which has absorptive properties improves laser exposure uniformity in the S/D regions. For example, the dielectric liner serves as a buffer layer that averages or distributes the heat from the laser incident to the S/D regions.

For example, in the case of a silicon nitride capping layer and silicon nitride liner layer, the capping layer may be about 25 nm thick while the liner may be about 75 nm. This results in the combined thickness of the silicon nitride over the gate to be about 100 nm while the thickness of silicon nitride over the S/D regions is about 75 nm. This results in the highest reflection or attenuation of the laser irradiation over the gate and minimum reflection or maximum absorption over the S/D regions. Therefore, a process window can be obtained to melt the junction region simultaneously while keeping the gate region intact. Other thicknesses for the layers may also be useful. The thicknesses may depend on the material used.

Figure 5F:
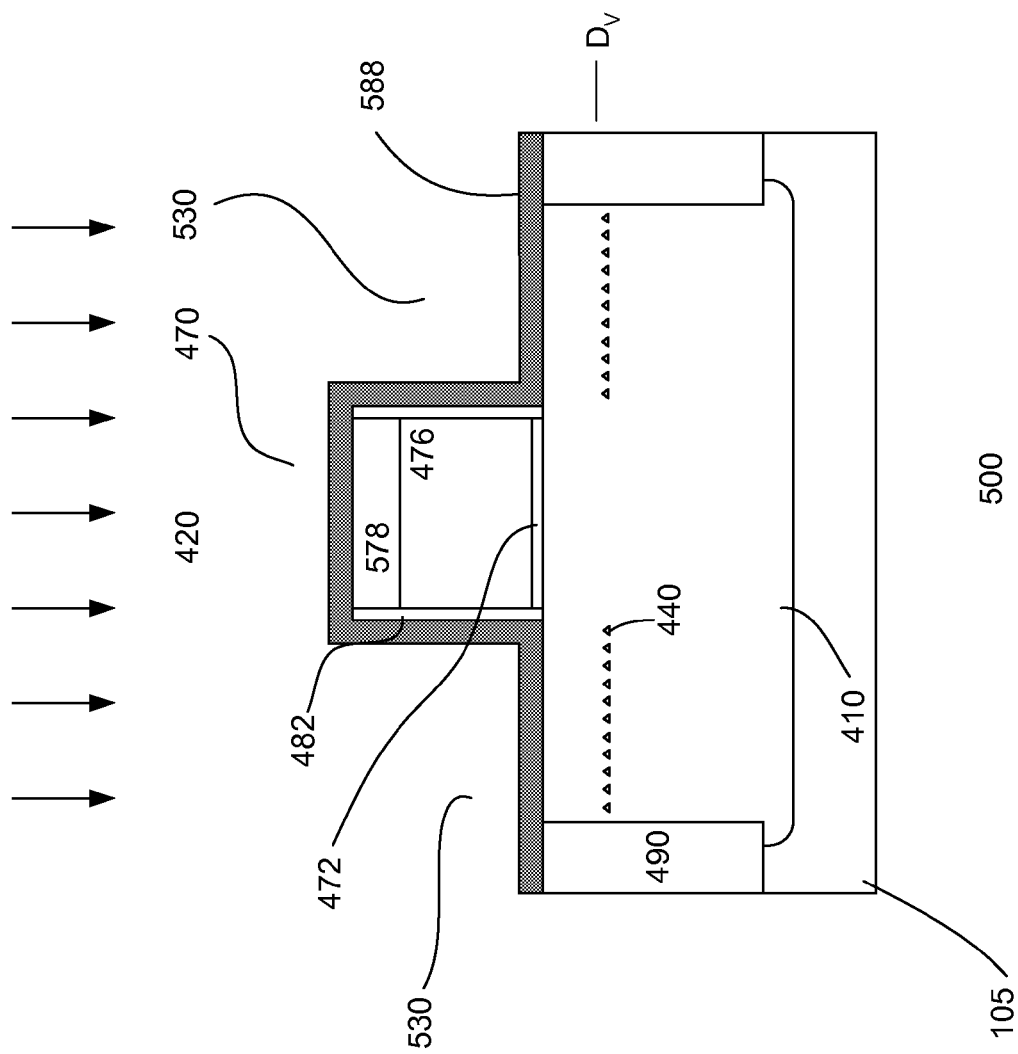

In FIG. 5f, the substrate is irradiated with electromagnetic radiation from a laser. The laser, for example, may be an excimer laser, such as KrF or XeCl. The laser may generate pulses in a wavelength of about 126-351 nm. Other types of laser sources may also be used to form the vacancies. For example, the laser should be able to melt the substrate's top surface instantaneously and facilitates rapid recrystallization quenching rate to induce the formation of vacancy defects. In one embodiment, the spot size of the laser exposure is in the dimensions of micrometers. Other spot size dimensions may also be useful.

The STI and gate along with the liner reflects the laser. The S/D regions of the device region or where doped S/D regions are subsequently formed absorb the laser, causing vacancy defects 440. A peak concentration of the vacancies from the irradiation occurs at a depth $D_V$, which is equal to about the maximum laser melt depth. The peak concentration of vacancies, for example, is about $10^{17}$-$10^{18}$ atm/cm$^3$. Other peak concentrations of vacancies may also be useful. The maximum melt depth can be adjusted to the desired depth by selecting the appropriate laser fluence.

In one embodiment, $D_V$ is selected based on the depth of the metal based contact, depending on the technology node. In one embodiment, $D_V$ is shallower than $D_D$. Providing $D_V$ at other depths may also be useful. For example, $D_V$ is shallower or less than the depth of the doped S/D regions. In other embodiments, $D_V$ is equal to about the depth of the S/D regions.

After forming the vacancy defects, the liner is removed. The removal of the liner layer, for example, may be achieved using a wet etch or RIE. In one embodiment, the liner material is selected to be different than that of the spacer material to provide etch selectivity. For example, if the spacer includes silicon oxide, the liner may then include silicon nitride or vice versa. Other types of materials may also be useful, depending on the etch selectivity of the two different materials.

Figure 5G:
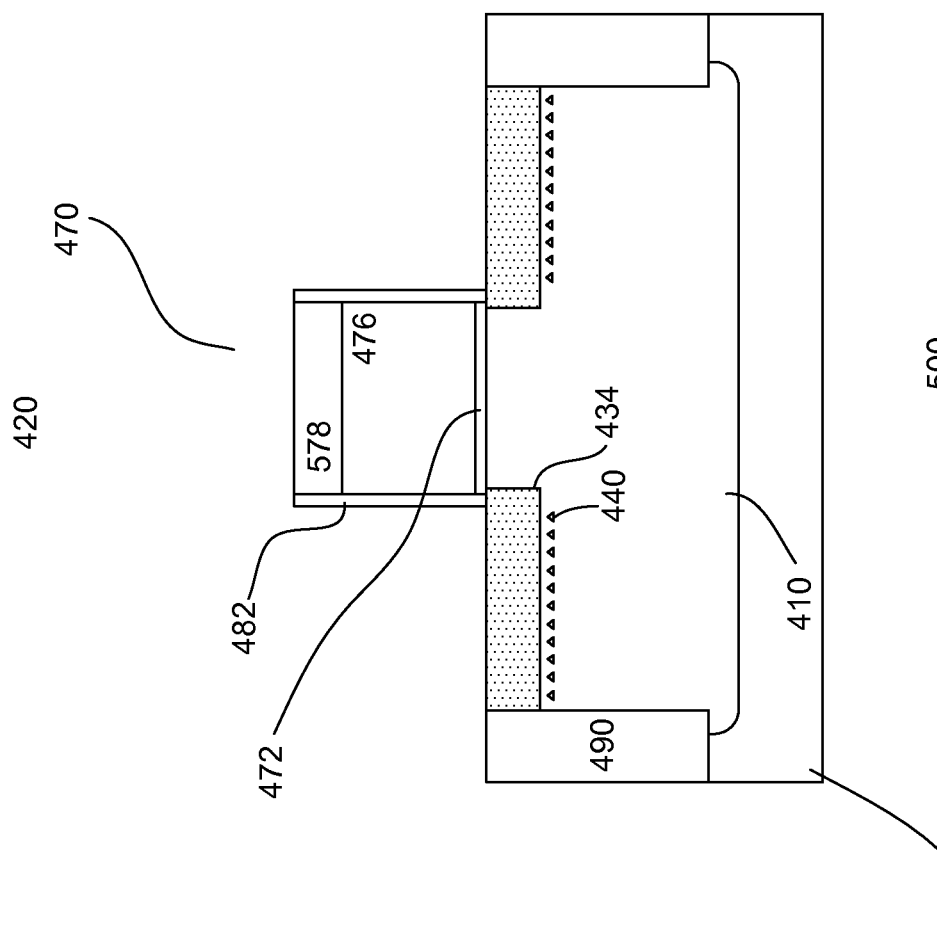

In one embodiment, as shown in FIG. 5g, LD regions 434 are formed on the substrate in the S/D regions of the device. The lightly doped regions have first polarity type dopants. To form the lightly doped regions, first polarity type dopants are implanted into the substrate. The implant, for example, may be self-aligned with respect to the device region. For example, the implant may be doped into the substrate unprotected by the gate and isolation regions. The depth of the lightly doped regions, for example, is about 0.01-0.04 μm. For example, the LD regions are shallower than $D_V$. Forming the LD regions having other depths may also be useful. The implant dose may be from about 5E12-5E13/cm$^2$ and the implant energy may be from about 10K-100K eV. Other implant parameters may also be useful.

Figure 5H:
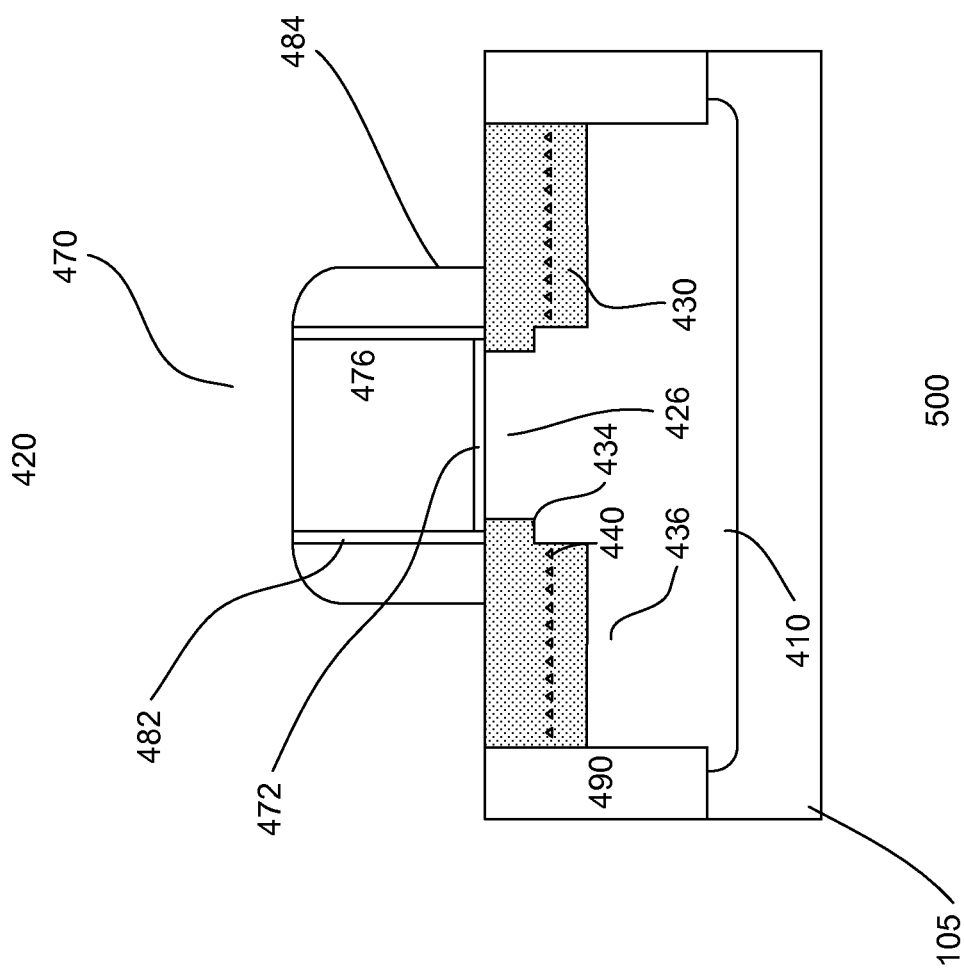

Sidewall spacers 484 are formed on the sidewalls of the gates, as shown in FIG. 5h. In one embodiment, the sidewall spacers are formed over the offset spacers. For example, the sidewall spacers are main or second spacers formed over the offset or first spacers. To form the sidewall spacers, a dielectric layer is deposited on the substrate. The dielectric layer, for example, may be silicon oxide. The sidewall spacers may be of a material which is different than that of the offset spacers to provide etch selectivity during processing. For example, the sidewall spacers may be silicon nitride whereas the offset spacers include silicon oxide. Other types of dielectric material may also be used. In some embodiments, the offset and sidewall spacers may be of the same material. The dielectric layer may be formed by CVD. The dielectric layer may also be formed using other techniques. The thickness, for example, may depend on the desired width of the spacers. An anisotropic etch, such as RIE, may be performed to remove horizontal portions of the dielectric layer, leaving spacers on the sidewalls of the gate. In some applications, the spacer may be formed from multiple dielectric layers.

After the spacers are formed, HD regions 436 are formed in the S/D regions 430 on the substrate. The heavily doped regions have first polarity type dopants. Forming the HD regions include implanting first polarity type dopants into the substrate. The implant, like the one that forms the LD regions, is self-aligned with respect to the device region. For example, the implant may be doped into the substrate unprotected by the gate, field structure and isolation regions. In this case, the sidewall spacers cause the HD regions to be offset. In one embodiment, the doped S/D region includes a shallower LD portion and a deeper HD portion. The HD portion may be deeper than $D_V$. The depths of the LD and HD regions depend on the technology node. The implant dose for the HD regions may be about E14 to E15 and the implant dose for the LD regions may be about E12 to E13. The implant energy for the HD regions may be about >10-25 keV for BF2 and the implant energy for the LD regions may be about <10 keV. Employing other implant parameters may also be useful. In some embodiments, the HD regions may be about the same depth as $D_V$. Such a configuration may be used to form a transistor with Schottky contacts. Providing other configurations of the LD and HD portions may also be useful. For example, the HD and LD portions may have about the same depth.

In one embodiment, the substrate is annealed to activate the dopants of the doped S/D regions. The anneal, in one embodiment, may include RTP, laser, flash, etc. The anneal, for example, may be performed at a temperature of about 800 to >1000° C. Other annealing parameters may also be useful. During the anneal, the vacancies will combine with the dopants. This results in the desired dopant pile-up 480 at $D_V$ after the anneal as shown in FIG. 5i.

The gate capping layer is removed. In one embodiment, the gate capping layer is removed after the anneal to activate the dopants. In other embodiments, the gate capping layer is removed before the activation. The removal of the gate capping layer, for example, may be achieved using wet process. Other techniques may also be used to remove the liner and capping layer. Removing the gate capping layer exposes the gate electrode.

Figure 5I:
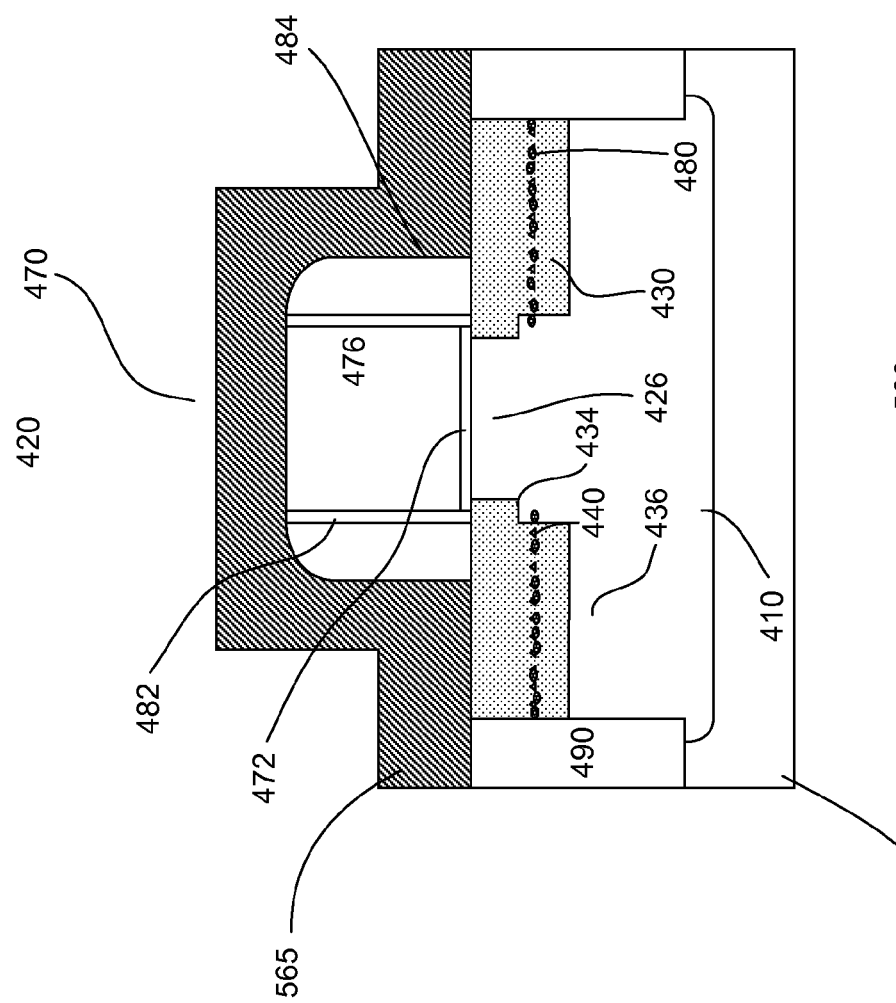

Referring to FIG. 5i, a metal layer 565 is formed over the substrate. In one embodiment, the metal is blanket deposited, covering the gate structure, including the spacers and substrate over the S/D regions and STI. In one embodiment, the metal layer may be nickel or a nickel alloy. Other types of metal may also be useful. For example, metals such as titanium, cobalt, or other metals or alloys thereof, including nickel, may be used for the contacts. The metal layer, for example, may be deposited by sputtering. Other techniques for forming the metal layer may also be useful.

The metal layer is formed with a thickness $T_M$. In one embodiment, $T_M$ is at least equal or greater than about a thickness sufficient to form metal based contacts in the S/D regions having a depth $D_C$ located at about $D_V$ in a subsequent process. The thickness of the metal layer can be equal to the thickness to be fully consumed during the thermal process to form the metal based contacts such that the depth of the metal based contact is equal to about $D_V$. In other embodiments, the thickness of the metal layer can be greater than the thickness for full consumption. In such case, the thermal process may be controlled to consume an amount of the metal layer to form metal based contacts having a depth equal to about $D_V$.

The consumption of substrate material during the thermal process may depend on the material of the metal layer and substrate. For example, in the case of nickel metal layer and a silicon substrate, x nm of nickel is used to react with 1.84x nm of silicon to form 2.22x nm of nickel silicide.

Figure 5J:
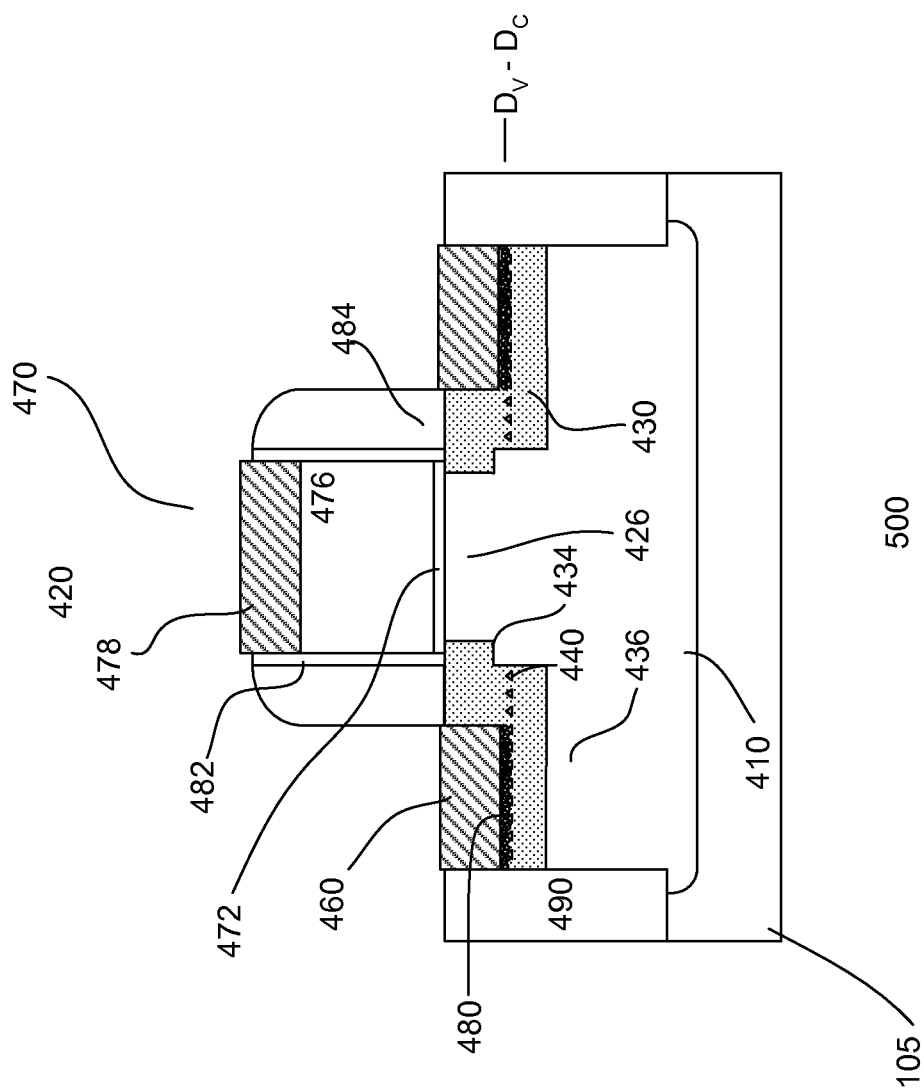

In FIG. 5j, the substrate is processed to form metal based contacts 460 on exposed portion of the substrate, such as the S/D regions. The process also forms a metal gate contact 478 on the exposed gate electrode. The process, for example, is a thermal process which causes a reaction with the substrate or gate material and the metal layer to form the metal based contacts. No reaction occurs, for example, over the gate sidewalls or the STI. The thermal process, in one embodiment, is performed at a temperature of about 450 to 550° C. for about 60 s for Ni. Performing the thermal process at other temperatures may also be useful. For example, the temperature may depend on the material of the metal layer and substrate. The thermal process forms, for example, metal silicide contacts in the case of a silicon substrate. Forming other types of metal based contacts is also useful, depending on the metal layer and substrate material. For example, a nickel germanocide contact may be formed for a nickel metal layer and a germanium substrate.

The thermal process may fully consume the metal layer to form metal based contacts having a contact depth $D_C$ equal to about $D_V$. In other embodiments, the thermal process forms metal based contacts having a contact depth $D_C$ without fully consuming the metal layer. This leaves a portion of un-reacted metal layer above the metal based contacts as well as over the sidewall spacers and STI.

During the thermal process, dopants of the doped contact region diffuse to the substrate below due to low solubility limit of the metal based contact. This results in high concentrations of dopants 480 piling up (dopant pile up) at the crystal/metal based contact interface (e.g., $D_V$ or $D_C$) wherein the vacancies are disposed, as shown in FIG. 5j. For example, the dopants pile up is located at about the silicon/silicide interface for a silicon substrate. The vacancies enhance activation of the dopants in the dopant pile up. Furthermore, the vacancies act as a diffusion barrier against the downward diffusion of dopants deeper into the substrate, trapping more dopants at the crystal/metal based contact interface. The enhanced activation and/or barrier properties against the downward diffusion of dopants, resulting in dopant pile-up at the interface which leads to reducing the contact resistance.

After forming the contact, excess unreacted metal is removed. For example, unreacted metal over the metal based contacts, sidewall spacers and STI is removed. Removal of the unreacted metal layer may be achieved by, for example, a wet etch selective to the metal based contact material. The metal based contacts over the S/D regions and gate electrode remain.

After forming the metal based contacts, the sidewall spacers may be removed. For example, the sidewall spacers may be removed, leaving the offset spacers. The sidewall spacers may be removed by a wet etch selective to the offset spacers. In other embodiments, the sidewall spacers remain.

The process further continues to form the device. For example, the process continues to form a dielectric layer. The dielectric layer may be a pre-metal dielectric (PMD) layer. Contacts to the metal based contacts may be formed in the device. Additional processes may include forming of one or more interconnect levels, final passivation, dicing, assembly, packaging and testing. Other processes are also useful. For example, other components, such as low voltage, medium voltage, and high voltage I/O devices can be formed prior to forming the interconnections.

Figure 6B:
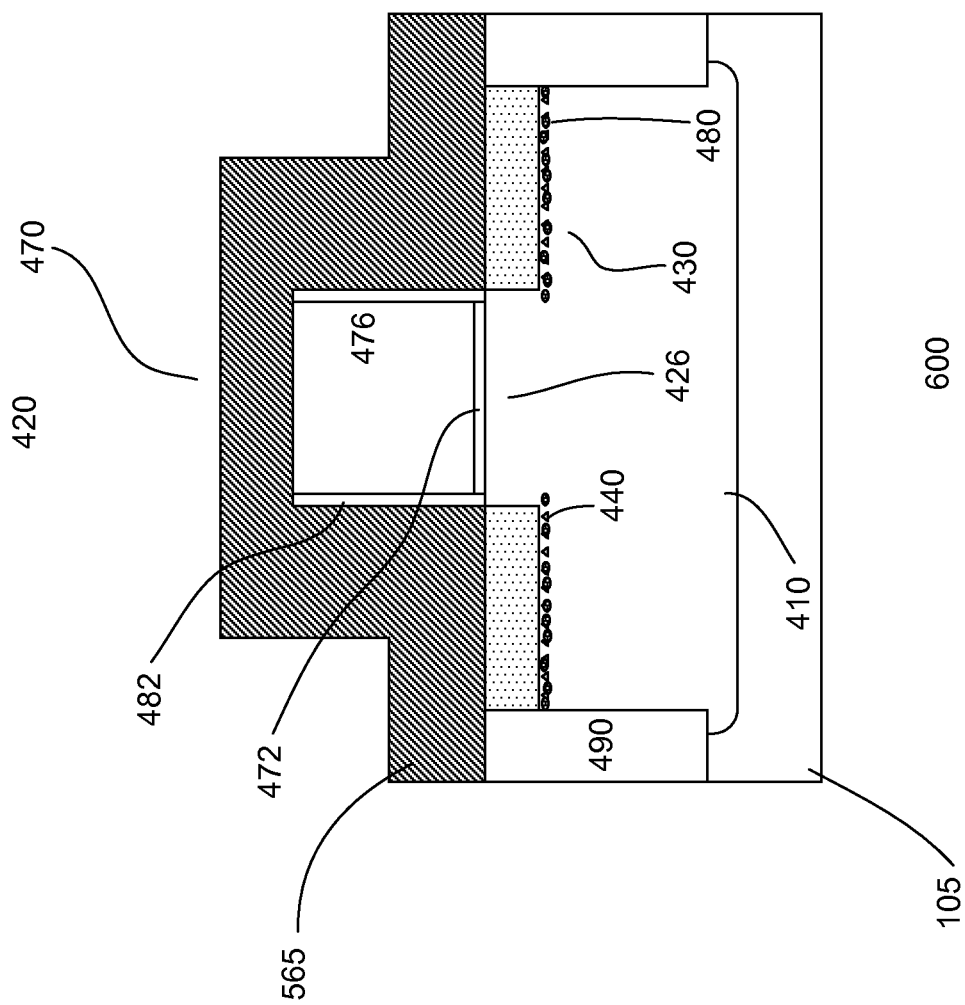
Figure 6C:
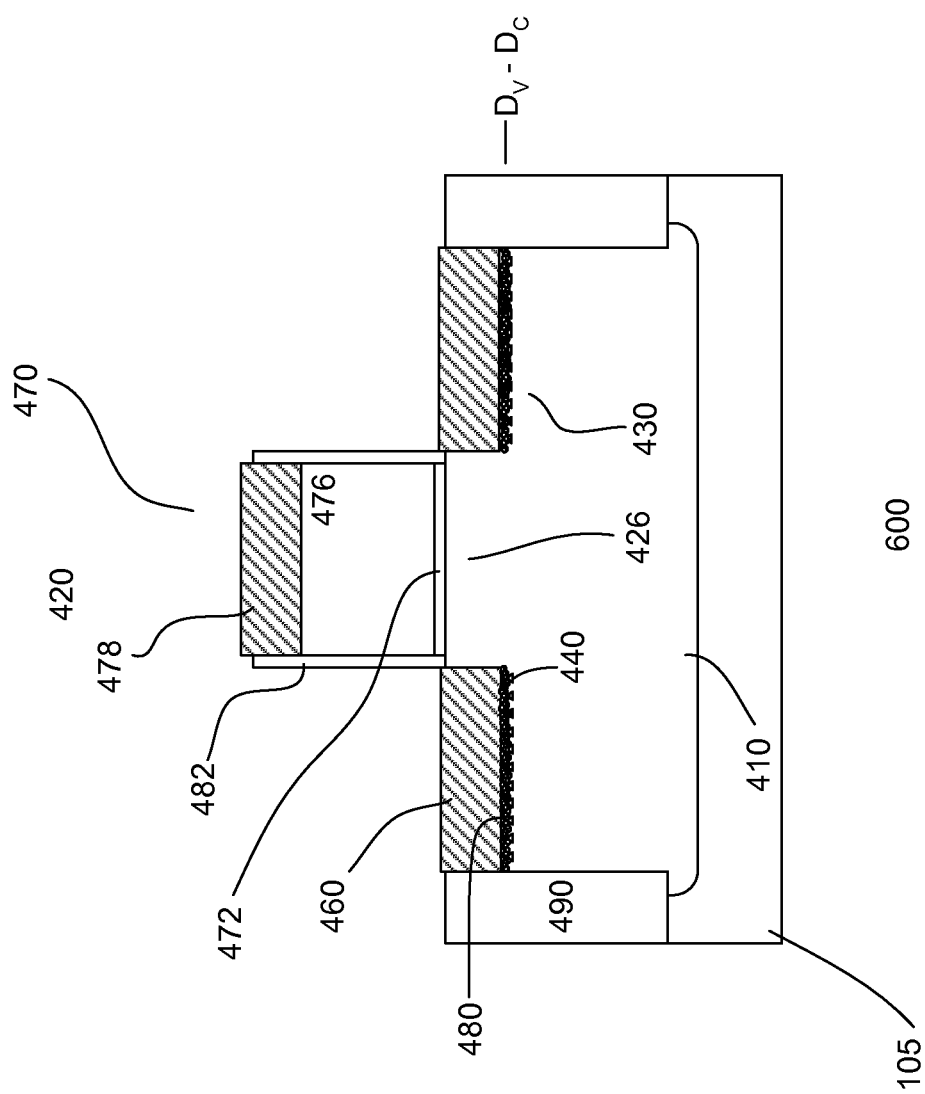

FIGS. 6a-c show cross-sectional views of another embodiment of a process for forming a device 600. The process is similar to that described in FIGS. 5a-j. As such, common elements may not be described or described in detail. Referring to FIG. 6a, the process is at a similar stage as that described in FIG. 5g. For example, sidewall spacers 482 are formed on sidewalls of the gate. The sidewall spacers, for example, are dielectric sidewall spacers. The sidewall spacers may be silicon oxide. Other types of dielectric materials, such as silicon nitride or oxynitride, may also be useful. The sidewall spacers, for example, are offset spacers.

In one embodiment, first polarity type doped regions are formed adjacent to the sides of the gate. The doped regions, for example, are heavily doped first polarity type regions. The heavily doped regions serve as S/D regions of the transistor. The doped regions, for example, are formed by implanting first polarity type dopants into the substrate. The implant, for example, is self-aligned with respect to the device region. The implant dose and the implant energy may depend on the technology node. In one embodiment, the doped contact region has a depth $D_D$ which is about the same as $D_V$.

In one embodiment, the substrate is annealed to activate the dopants of the doped S/D regions. The anneal, in one embodiment, may include RTP, laser, flash, etc. The anneal, for example, may be performed at a temperature of about 800 to >1000° C. Performing the anneal at other annealing parameters may also be useful. During the anneal, the vacancies will combine with the dopants. This results in the desired dopant pile-up 480 at $D_V$ after the anneal as shown in FIG. 6b.

The gate capping layer is removed. In one embodiment, the gate capping layer is removed after the anneal to activate the dopants. In other embodiments, the gate capping layer is removed before the activation of dopants. The removal of the gate capping layer, for example, may be achieved using wet process. Other techniques may also be used to remove the liner and capping layer. Removing the gate capping layer exposes the gate electrode.

Referring to FIG. 6b, a metal layer 565 is formed over the substrate. In one embodiment, the metal is blanket deposited, covering the gate structure, including the spacers and substrate over the S/D regions and STI. In one embodiment, the metal layer may be nickel or a nickel alloy. Other types of metal may also be useful. For example, metals such as titanium, cobalt, or other metals or alloys thereof, including nickel, may be used for the contacts. The metal layer, for example, may be deposited by sputtering. Other techniques for forming the metal layer may also be useful.

The metal layer is formed with a thickness $T_M$. In one embodiment, $T_M$ is at least equal or greater than about a thickness sufficient to form metal based contacts in the S/D regions having a depth $D_C$ located at about $D_V$ or $D_D$ in a subsequent process. The thickness of the metal layer can be equal to the thickness to be fully consumed during the thermal process to form the metal based contacts such that the depth of the metal based contact is equal to about $D_V$ or $D_D$. In other embodiments, the thickness of the metal layer can be greater than the thickness for full consumption. In such case, the thermal process may be controlled to consume an amount of the metal layer to form metal based contacts having a depth equal to about $D_V$ or $D_D$.

In FIG. 6c, the substrate is processed to form metal based contacts 460 on exposed portion of the substrate, such as the S/D regions. The process also forms a metal gate contact 478 on the exposed gate electrode. The process, for example, is a thermal process which causes a reaction with the substrate or gate material and the metal layer to form the metal based contacts. No reaction occurs, for example, over the gate sidewalls or the STI. The thermal process, in one embodiment, is performed at a temperature of about 450 to 550° C. for 60 s of anneal time for Ni. Performing the thermal process at other temperatures may also be useful. For example, the temperature may depend on the material of the metal layer and substrate. The thermal process forms, for example, metal silicide contacts in the case of a silicon substrate. Forming other types of metal based contacts is also useful, depending on the metal layer and substrate material. For example, a nickel germanocide contact may be formed for a nickel metal layer and a germanium substrate.

The thermal process may fully consume the metal layer to form metal based contacts having a contact depth $D_C$ equal to about $D_V$ or $D_D$. In other embodiments, the thermal process forms metal based contacts having a contact depth $D_C$ without fully consuming the metal layer. This leaves a portion of un-reacted metal layer above the metal based contacts as well as over the sidewall spacers and STI.

During the thermal process, dopants of the doped contact region diffuse to the substrate below due to low solubility limit of the metal based contact. This results in high concentrations of dopants 480 piling up (dopant pile up) at the crystal/metal based contact interface (e.g., $D_V$ or $D_C$) where in the vacancies are disposed as shown in FIG. 6c. For example, the dopants pile up is located at about the silicon/silicide interface for a silicon substrate. The vacancies enhance activation of the dopants in the dopant pile up. Furthermore, the vacancies act as a diffusion barrier against the downward diffusion of dopants deeper into the substrate, trapping more dopants at the crystal/metal interface. The enhanced activation and/or barrier properties against the downward diffusion of dopants, resulting in dopant pile-up at the interface which leads to reducing the contact resistance The process further continues to complete the formation of the device, as described in FIG. 5j and onwards.

Figure 7B:
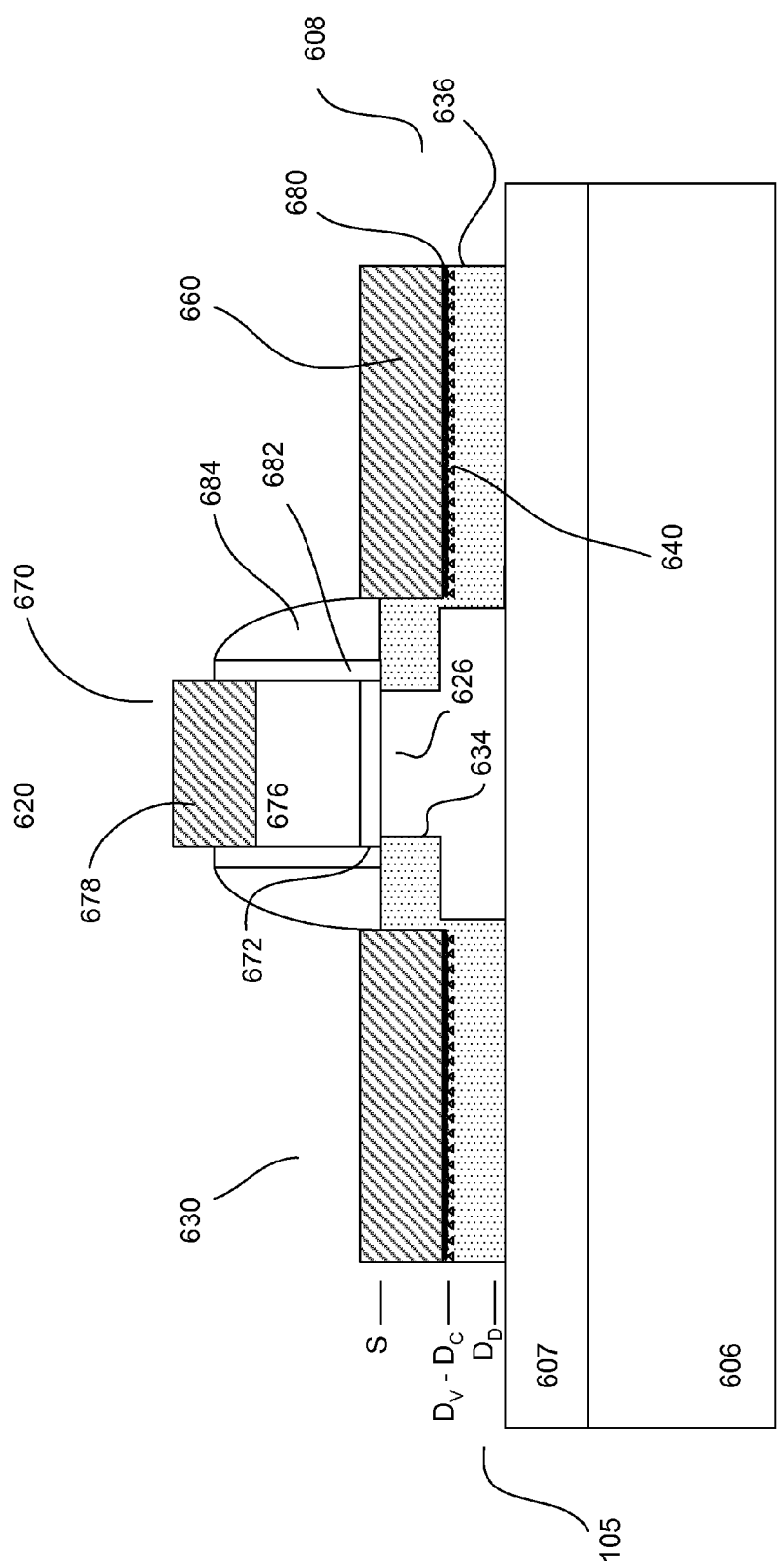

FIGS. 7a-b show top and cross-section views of an embodiment of a device 700. The device includes a substrate 105. The substrate, in one embodiment, is a COI substrate. For example, the substrate includes a bulk crystal and surface crystal layers 606 and 608 sandwiching a buried dielectric layer, such as an oxide layer 607. Other types of dielectric materials may also be useful. In the case of a SOI substrate, a bulk and surface silicon layer sandwich a buried dielectric layer. Other types of COI substrates may also be useful.

In other embodiments, the substrate may be semiconductor substrate. The substrate, for example, may be a silicon substrate. Other types of substrates may also be useful. A dielectric layer 607 is formed over the substrate. An epitaxial layer 608 may be formed over the dielectric layer. Other configurations of substrates may also be useful.

The substrate includes a device region over the dielectric layer. The device region includes a transistor 620. In one embodiment, the transistor includes a fin structure 624 disposed on the dielectric layer. The fin structure, for example, forms a base of a fin type transistor, such as a finfet. Providing other types of transistors in the device region may also be useful. In one embodiment, the fin structure has a height of about 200-1000 Å. Other heights for the fin structure may also be useful.

In one embodiment, the surface crystal layer or epitaxial layer which is used to form the fin structure may be doped with second polarity dopants. This, for example, results in a fin structure which is doped with second polarity dopants. The fin structure may be doped with n-type dopants for a p-type device or p-type dopants for a n-type device. The fin structure may be lightly (x⁻) or intermediately (x) doped with second polarity type dopants. Other dopant concentrations may also be useful. For example, the dopant concentration may depend on the technology node, such as the gate length and thickness of the gate oxide of the device.

The fin structure includes first and second pad regions 625 coupled by a neck region 628. In one embodiment, the pad regions are wider in width than the neck region.

A gate 670 which traverses the neck portion of fin structure is provided. The gate, for example, includes a gate electrode 676 over a gate dielectric 672. The gate dielectric, for example, may be silicon oxide while the gate electrode may be polysilicon. The gate dielectric, for example, may have a thickness of about 10 to a few hundred Å while the gate electrode may be about a few hundred to thousand Å thick. In some embodiments, the gate electrode may be a doped electrode. For example, the gate electrode may be polysilicon doped with first polarity type dopants to lower the poly gate resistance. Other types of gate dielectrics and gate electrodes as well as dimensions may also be useful. For example, the gate dielectric may be a high k gate dielectric and the gate electrode may be a metal gate electrode. Other configurations of gate layers of the gate may also be useful. The gate may include a gate pad portion (not shown) at an end. The gate pad portion may be wider than the gate portion that traverses the neck portion of the fin structure. The gate pad portion facilitates forming a contact for the gate terminal of the transistor.

The pad regions, for example, serve as main portions of S/D regions 630 while the neck portion serves as a channel 626 of the transistor. The S/D regions may be doped with first polarity dopants for first polarity type transistor. For example, p-doped S/D regions produce a p-type transistor. The use of n-doped S/D regions may also be useful for a n-type transistor. In some embodiments, a portion of the neck portion may serve as part of the S/D regions. For example, portions of the neck portion adjacent to the pad regions serve as part of the S/D regions, with the neck portion therebetween serving as the channel. The portions of the S/D regions in the neck region may be LD regions 634 while the S/D regions in the pad regions may be HD regions 636. Other configurations of S/D regions may also be useful.

The HD regions have a depth $D_D$. As shown, the depth $D_D$ extends a portion of the height of the fin structure. In one embodiment, the depth depends on the technology node. Other depths for $D_D$ may also be useful. For example, the HD regions may extend the height of the fin structure. Other configurations of the HD regions may also be useful. In one embodiment, the LD regions 634 underlap the gate. The depth of the LD regions depends on the technology node. Other depths for the LD regions may also be useful.

Sidewalls of the gate may be provided with dielectric spacers. The dielectric spacers, for example, may be silicon oxide spacers. Other types of dielectric materials may also be useful, such as silicon nitride or a combination of dielectric materials or layers. For example, the spacers may be composite spacers. The spacers may include an offset spacer 682 and a main spacer 684. The offset spacers may facilitate forming the LD regions while the main spacers facilitate forming the HD regions. Other configurations of spacers may also be useful. For example, the spacer may be a single spacer. The LD regions, for example, are formed after forming the offset spacers while the HD regions are formed after the main spacers. In some cases, the transistor may also include halo regions. Halo regions are second polarity doped regions abutting the S/D regions proximate to the gate.

The doped regions include vacancy defects 640. The vacancy defects, in one embodiment, are laser induced vacancy defects. For example, vacancies are created by irradiating substrate with electromagnetic radiation from a laser. The laser, for example, may be an excimer laser, such as KrF or XeCl. The laser may generate pulses in a wavelength of about 126-351 nm. Other types of laser sources may also be used to form the vacancies. For example, the laser should be able to melt the substrate's top surface instantaneously and facilitates rapid recrystallization quenching rate to induce the formation of vacancy defects. In one embodiment, the spot size of the laser exposure is in the dimensions of micrometers. Other spot size dimensions may also be useful.

A peak concentration of the laser induced vacancy defects is disposed in the substrate at a depth $D_V$, which is equal to about the maximum laser melt depth. The peak concentration of vacancies, for example, may be about $10^{17}$ to $10^{18}$ atom/cm³. Other peak concentrations of vacancies may also be useful. The maximum melt depth can be adjusted to the desired depth by selecting the appropriate laser fluence. In one embodiment, $D_V$ is shallower or less than the depth of the HD regions or $D_D$. As shown, $D_V$ is deeper than the LD regions. For example, the depths of $D_V$ and $D_D$ depend on the technology node. Providing $D_V$ at other depths may also be useful. For example, $D_V$ may be at other depths relative to $D_D$. In one embodiment, $D_V$ is less (shallower) than or equal to about $D_D$.

Metal based contacts 660 are provided in the doped regions. A metal based contact, in one embodiment, is a combination of the substrate material and a metal. For example, in the case of a silicon substrate, the metal based contact is a metal silicide contact. In the case of a germanium substrate, the metal based contact is a metal germanocide contact. Other types of metal based contacts may also be useful, depending on the substrate material. The contact, for example, may be a nickel or nickel alloy metal-semiconductor crystal contact. Other types of contacts may also be useful. For example, metals such as titanium, cobalt, or other metals or alloys thereof, including nickel, may be used for the contacts. In one embodiment, a depth $D_C$ of the metal based contacts is equal to about $D_V$. The top surface of the metal based contacts is above the substrate surface S.

The metal based contacts have a low dopant solubility limit. This low solubility limit causes the first polarity type dopants to segregate out of the doped contact regions where the metal based contacts are disposed. For example, dopants segregate from the doped contact regions where the metal based contact is disposed, resulting in high concentrations of dopants 680 piling up (dopant pile up) at the crystal/metal based contact interface (e.g., $D_V$ or $D_C$) where in the vacancies are disposed. For example, the dopants pile up is located at about the silicon/silicide interface for a silicon substrate. The vacancies enhance activation of the dopants in the dopant pile up. Furthermore, the vacancies act as a diffusion barrier against the downward diffusion of dopants deeper into the substrate, trapping more dopants at the crystal/metal based contact interface. The enhanced activation and/or barrier properties against the downward diffusion of dopants, resulting in dopant pile-up at the interface which leads to reducing the contact resistance.

In one embodiment, a metal gate contact 678 is disposed over the gate electrode. The metal gate contact, for example, includes the same metal as the metal based contacts in the doped regions. Forming the metal gate contact using a different material than the contacts in the contact regions is also useful. The metal gate contact is a combination of metal and gate electrode material. For example, the metal gate contact may be a metal silicide gate contact for a polysilicon gate electrode. Other types of metal gate contacts may also be useful.

Figure 8A:
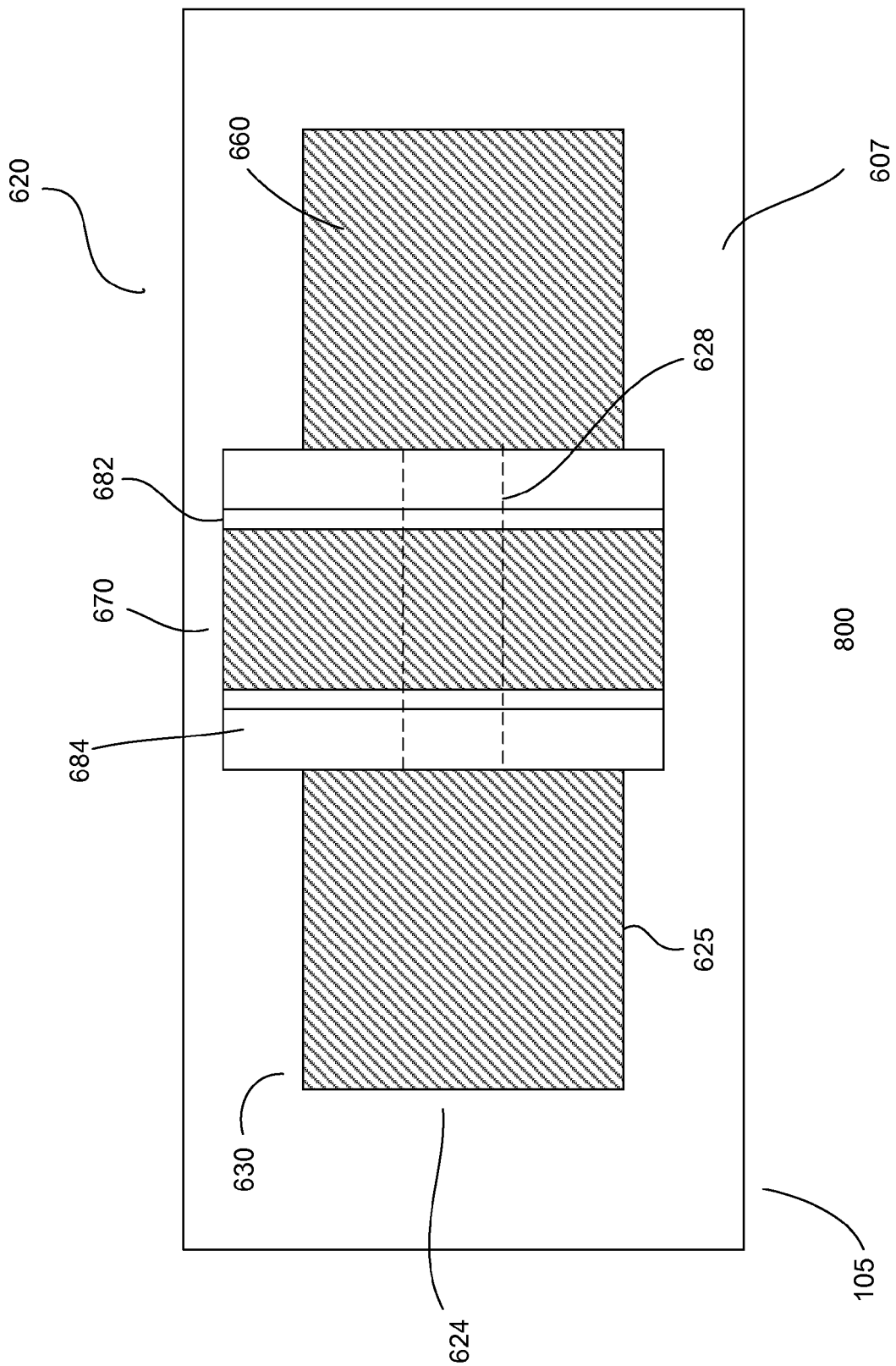
FIGS. 8a-b show top and cross-sectional views of another embodiment of a device.
Figure 8B:
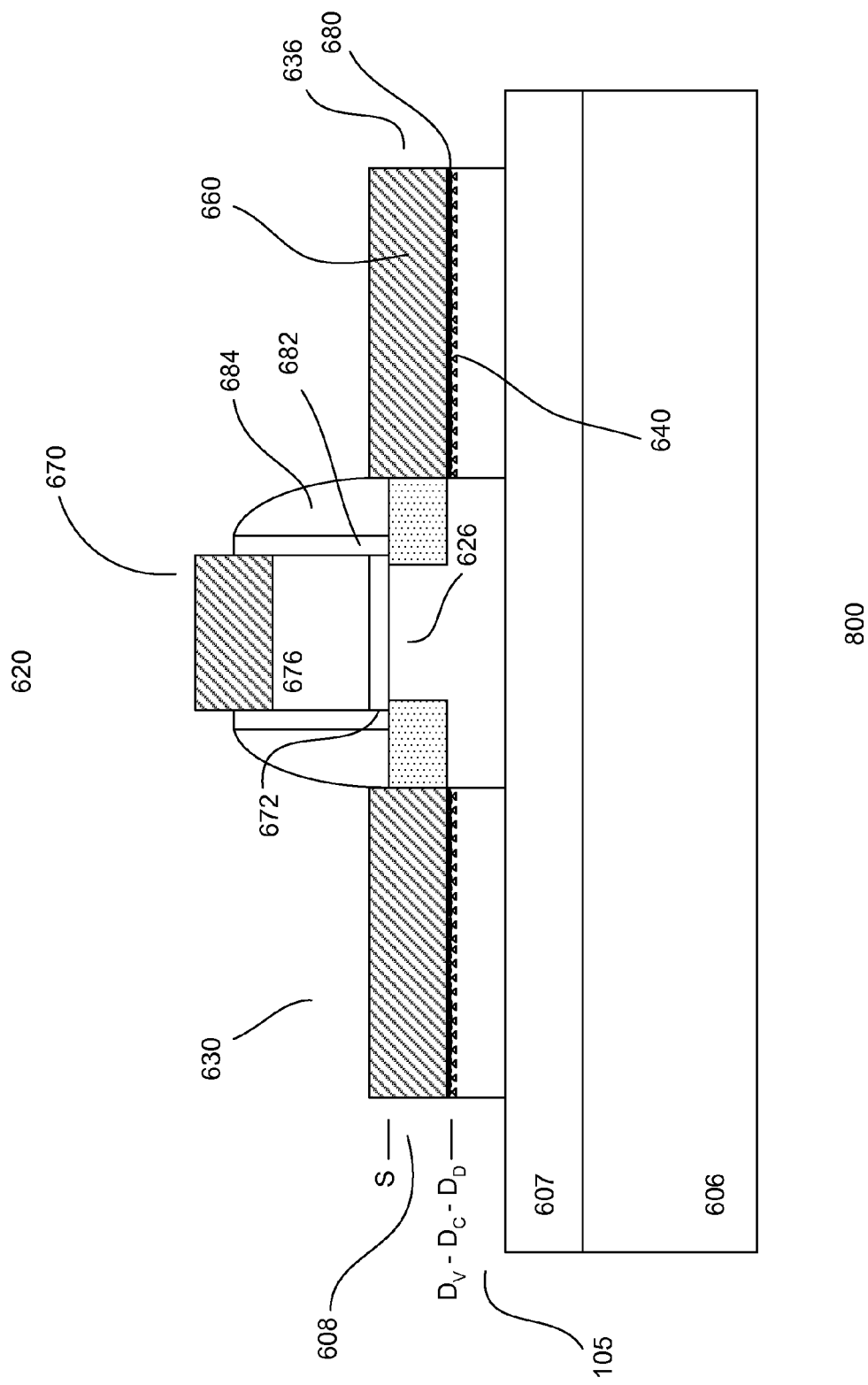

FIGS. 8a-b show top and cross-sectional views of another embodiment of a device 800. The device is similar to that described in FIGS. 6a-b. As such, common elements may not be described or described in detail. As shown, the device includes a substrate 105. The substrate, for example, is a COI substrate. Other types of substrates may also be useful. A fin structure 624 is disposed on a dielectric layer 607. The fin structure includes a gate 670 traversing a neck portion 628 of the fin structure. Doped S/D regions 630 are formed in the pad regions 625 of the fin structure. The doped S/D regions include HD regions 636 in the pad regions of the fin structure. As shown, the S/D regions have a depth $D_D$ which is located at about a depth $D_V$ of the peak concentration of the laser induced vacancy defects. The depth $D_D$ is also located at about a depth $D_C$ of the metal based contacts 660.

Figure 9B:
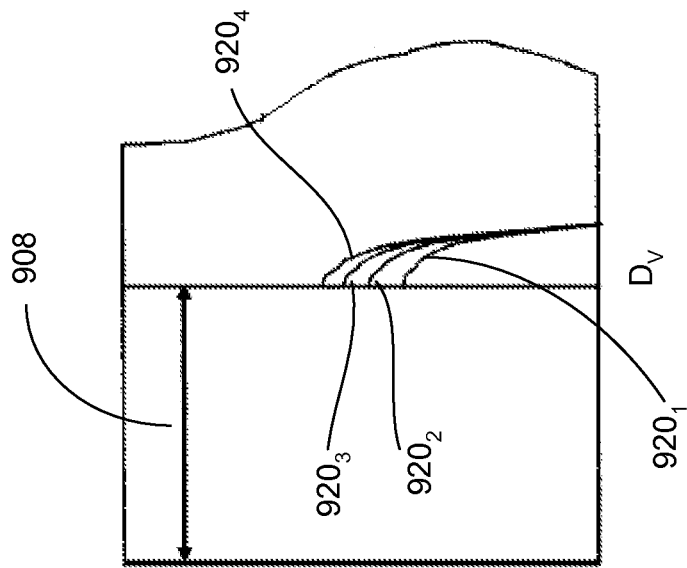
FIGS. 9a-b show simulations of laser irradiation of a substrate.
Figure 9A:
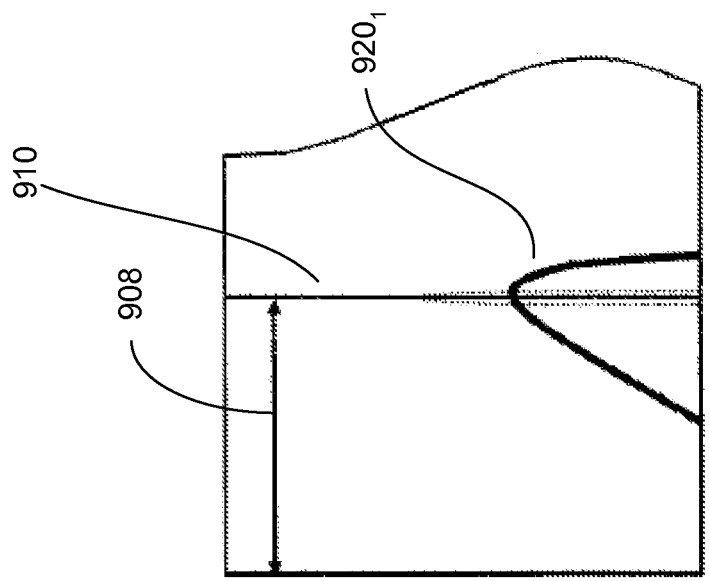

FIGS. 9a-b show simulations of vacancy distribution profile by laser irradiation. The simulations were performed using COMSOL. FIG. 9a shows a simulated vacancy distribution profile $920_1$ after a first laser shot. As can be seen in FIG. 9a, the laser irradiation melts a surface portion 908 of a crystalline Si substrate to induce the formation of vacancy defects. The vacancies distribution peaks at the maximum laser melt depth 910 or at the liquid/solid interface and decreases gradually towards the surface. FIG. 9b shows simulated vacancy distribution profiles after a series of four laser shots $920_{1-4}$, where the subscript 1 is the first shot and subscript 4 is the last shot. As can be seen, vacancies accumulate with each subsequent laser shot, with the peak located at the maximum melt depth $D_V$. With each additional laser shot, the amount of vacancies increases.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate with a contact region;
   forming vacancy defects in the substrate, wherein the vacancy defects have a peak concentration at a depth $D_V$; and
   forming a metal based contact in the contact region comprising
      forming a metal layer having a thickness $T_M$ to form the metal based contact having a depth $D_C$ which is equal to $D_V$, and
      performing a thermal process to form the metal based contact, wherein the metal based contact has the depth $D_C$ which is equal to $D_V$, wherein the vacancy defects lower the resistance of the metal based contact with the substrate.

2. The method of claim 1 wherein forming the vacancy defects in the substrate includes irradiating the substrate with electromagnetic radiation.

3. The method of claim 2 wherein the electromagnetic radiation includes laser.

4. The method of claim 2 wherein irradiating the substrate includes melting a portion of the substrate to form a melted layer.

5. The method of claim 4 wherein the peak concentration of the vacancy defects are formed at a desired maximum melt depth of the melted layer.

6. The method of claim 1 further comprises forming a masking layer having absorptive properties on top of the contact region.

7. The method of claim 1 further comprises implanting dopants of a first polarity type to form a doped contact region having a depth $D_D$ in the contact region.

8. The method of claim 7 wherein the depth $D_D$ is deeper than the depth $D_V$.

9. The method of claim 7 wherein the depth $D_D$ is the same as the depth $D_V$.

10. The method of claim 7 wherein implanting dopants is performed after forming the vacancy defects.

11. The method of claim 10 further comprising performing an anneal to activate the dopants, wherein the dopants are piled up at $D_V$.

12. The method of claim 10 further includes trapping of dopants at the depth $D_V$ during formation of the metal based contact.

13. A method of forming a device comprising:
   providing a substrate with a contact region having a bottom at a depth $D_D$;
   processing the substrate to form vacancy defects in the substrate in the contact region, the vacancy defects have a peak concentration at a depth $D_V$, wherein the processing is performed to form $D_V$ having a desired depth which is below the surface of the substrate to $D_D$;
   implanting dopants of a first polarity type to form a doped contact region having the depth $D_D$ in the contact region; and
   forming a metal based contact in the contact region, wherein the metal based contact has a depth $D_C$ which is equal to $D_V$, wherein the vacancy defects are displaced away from and above the depth $D_D$ of the doped contact region, the vacancy defects lower the resistance of the metal based contact with the substrate.

14. A device comprising:
   a substrate with a contact region having a bottom at a depth $D_D$;
   vacancy defects in the substrate, wherein the vacancy defects have a peak concentration at a depth $D_V$, wherein $D_V$ is at a desired depth which is below the surface of the substrate to $D_D$; and
   a metal based contact in the contact region, wherein the metal based contact has a depth $D_C$ which is equal to $D_V$, wherein the vacancy defects lower the resistance of the metal based contact with the substrate.

15. The device of claim 14 further comprises a doped contact region having the depth $D_D$ in the contact region.

16. The device of claim 15 wherein the depth $D_D$ is deeper than the depth $D_V$.

17. The device of claim 15 wherein the depth $D_D$ is the same as the depth $D_V$.

18. The device of claim 14 wherein the vacancy defects include laser induced vacancy defects.

19. The method of claim 7 wherein the substrate comprises a crystalline material and the dopants are piled up at a crystal/metal based contact interface, and the vacancy defects are displaced away and above the depth $D_D$ of the doped contact region.

\* \* \* \* \*